US008723569B2

(12) United States Patent
Tokuhiro

(10) Patent No.: US 8,723,569 B2
(45) Date of Patent: May 13, 2014

(54) SIGNAL RECEIVING CIRCUIT, MEMORY CONTROLLER, PROCESSOR, COMPUTER, AND PHASE CONTROL METHOD

(75) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/493,421

(22) Filed: Jun. 11, 2012

(65) Prior Publication Data

US 2012/0242385 A1 Sep. 27, 2012

Related U.S. Application Data

(63) Continuation of application No. PCT/JP2009/071685, filed on Dec. 25, 2009.

(51) Int. Cl.
*H03L 7/06* (2006.01)
(52) U.S. Cl.
USPC ............ 327/158; 327/141; 327/144; 327/161
(58) Field of Classification Search
USPC ...................... 327/141, 144–163; 331/15–17; 375/373–376
See application file for complete search history.

(56) References Cited

U.S. PATENT DOCUMENTS

| | | | | |
|---|---|---|---|---|
| 5,969,551 A * | 10/1999 | Fujioka | ........................ | 327/149 |
| 6,111,446 A * | 8/2000 | Keeth | ............................ | 327/258 |
| 6,121,815 A * | 9/2000 | Terada et al. | ................. | 327/292 |
| 6,178,212 B1 * | 1/2001 | Akashi | .......................... | 375/355 |
| 6,397,312 B1 | 5/2002 | Nakano et al. | | |
| 6,968,026 B1 * | 11/2005 | Li et al. | ......................... | 375/371 |
| 7,138,844 B2 | 11/2006 | Lee et al. | | |
| 7,234,069 B1 * | 6/2007 | Johnson | ........................ | 713/400 |
| 7,298,188 B2 | 11/2007 | Kawasaki | | |
| 7,318,167 B2 * | 1/2008 | Li et al. | .......................... | 713/500 |
| 7,362,107 B2 | 4/2008 | Tseng et al. | | |
| 7,711,973 B2 | 5/2010 | Sakamaki | | |
| 2002/0196883 A1 | 12/2002 | Best et al. | | |
| 2003/0086303 A1 * | 5/2003 | Jeong | ........................ | 365/189.05 |
| 2003/0218486 A1 * | 11/2003 | Kwak | ............................ | 327/158 |
| 2004/0044919 A1 | 3/2004 | Dabral | | |
| 2004/0143775 A1 * | 7/2004 | Li et al. | ......................... | 713/401 |

(Continued)

FOREIGN PATENT DOCUMENTS

| | | |
|---|---|---|
| EP | 2065894 A1 | 6/2009 |
| JP | 03-171945 A | 7/1991 |

(Continued)

OTHER PUBLICATIONS

International Search Report and Written Opinion corresponding to International Patent Application No. PCT/JP2009/071685 dated Sep. 28, 2010.

(Continued)

*Primary Examiner* — Brandon S Cole
(74) *Attorney, Agent, or Firm* — Squire Sanders (US) LLP

(57) ABSTRACT

A signal receiving circuit includes a phase detection unit and a delay control unit. The phase detection unit detects a phase difference between a received signal and a clock signal. The delay control unit receives the phase difference, delays a phase of the received signal in a range not exceeding a delay amount determined by using a predetermined phase difference as a unit, and changes, when the phase difference exceeds the predetermined phase difference, a delay amount of the received signal by using the predetermined phase difference as a unit.

16 Claims, 26 Drawing Sheets

(56) References Cited

U.S. PATENT DOCUMENTS

| | | | |
|---|---|---|---|
| 2004/0251936 A1* | 12/2004 | Gomm | 327/141 |
| 2005/0007166 A1* | 1/2005 | Shin | 327/158 |
| 2008/0043545 A1 | 2/2008 | Vink et al. | |
| 2009/0206884 A1* | 8/2009 | Shin | 327/2 |

FOREIGN PATENT DOCUMENTS

| | | | |
|---|---|---|---|
| JP | 11-007335 A | 1/1999 | |
| JP | 11-025029 A | 1/1999 | |
| JP | 2006-107352 A | 4/2006 | |
| JP | 2006-209638 A | 8/2006 | |
| JP | 2007-536773 A | 12/2007 | |
| JP | 2008-071018 A | 3/2008 | |
| JP | 2008-533916 A | 8/2008 | |

OTHER PUBLICATIONS

Supplementary European Search Report dated Jul. 19, 2013 corresponding to European Patent Application No. 09852588.4.

* cited by examiner

FIG.12

| CLK | a | b | FFO1 | FFO2 | DELAY INFORMATION OF PHASE |
|---|---|---|---|---|---|
| H | L | L | L | L | OVERDELAY (ADVANCE PHASE OF DQS) |
| H | L | H | L | H | DELAY OPPOSITE 180 DEGREES |
| H | H | L | H | L | APPROPRIATE DELAY (OK) |
| H | H | H | H | H | INSUFFICIENT DELAY (DELAY PHASE OF DQS) |

FIG.14

| 7 DIGIT BINARY | DELAY INFORMATION |
|---|---|
| | ☐☐ ☐☐ ☐☐☐<br>NUMBER OF ROUNDS: INDICATING HOW MANY TIMES DOES PHASE ROUND    CLK SELECTION: INDICATING CLK HAVING PHASE DETERMINED BY USING 90 DEGREES AS A UNIT    DL COMPONENT: INDICATING ADJUSTMENT OF DELAY LESS THAN 90 DEGREES |

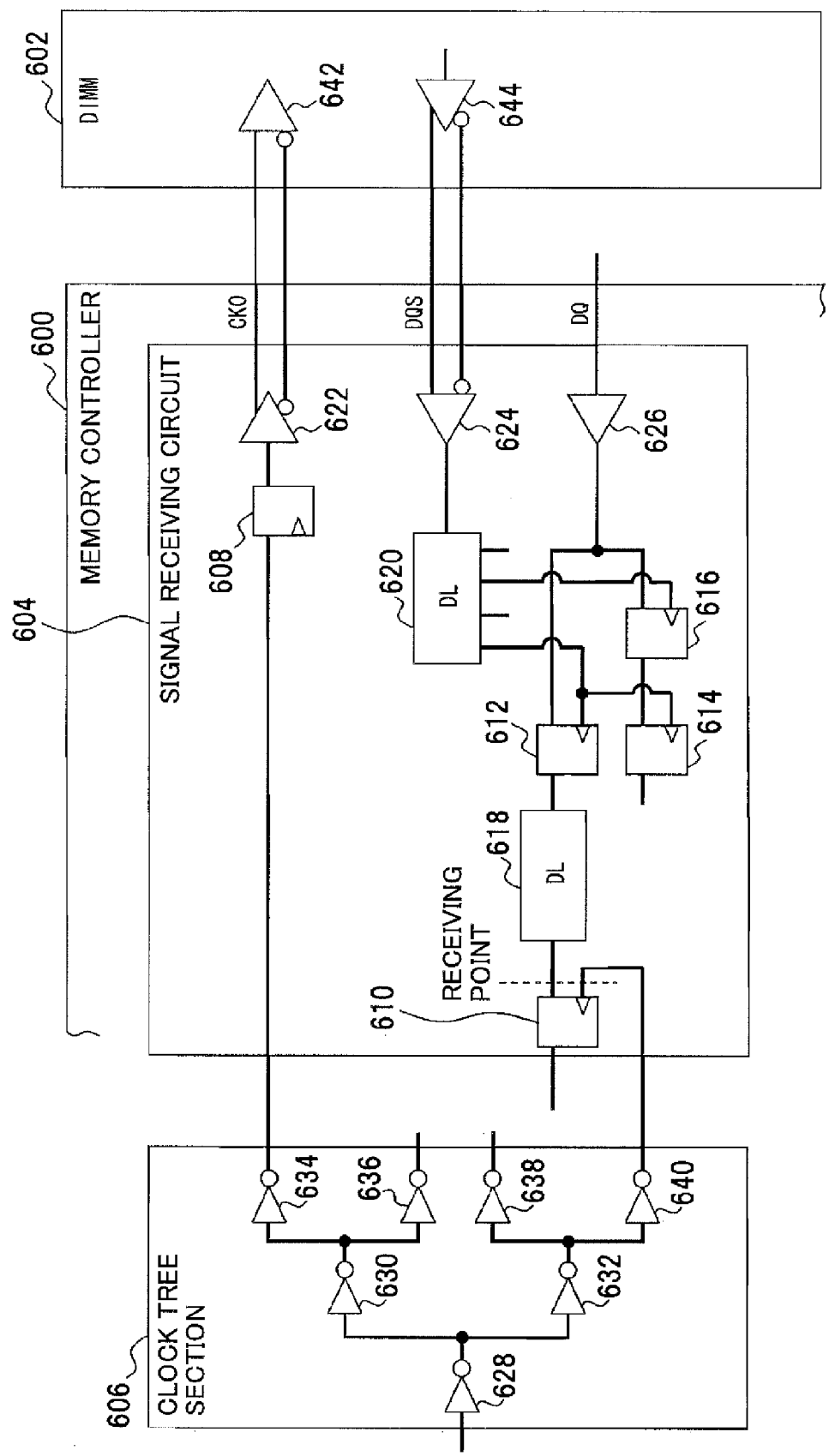

FIG.24

| PARAMETERS | LSI INTERNAL CLOCK SIDE (CLOCK TREE SECTION SIDE) | RECEIVED DATA SIDE (SIGNAL RECEIVING SIDE) |
|---|---|---|
| (1) CLOCK TREE SECTION | 1,000ps +/-100ps | 1,000ps +/-100ps |
| (2) DDR SIGNAL RECEIVING SECTION OUTPUT BUTTER DELAY | | 1,000ps +/-500ps |
| (3) DELAY IN TRANSMISSION PATH (SIGNAL RECEIVING SECTION ->DIMM) | | 7.3x (TRANSMISSION LENGTH)+/-10% |
| (4) DELAY FROM CK INPUT TOP DQS OUTPUT IN DIMM, tDQSCK | | +/-265ps |
| (5) DELAY IN TRANSMISSION PATH (DIMM ->(SIGNAL RECEIVING SECTION) | | 7.3x (TRANSMISSION LENGTH)+/-10% |
| (6) DDR SIGNAL RECEIVING SECTION INPUT BUFFER DELAY | | 1,000ps +/-500ps |
| (7) DELAY IN DL(a) (FIGURE WHEN 3/4 CYCLE IS SHIFTED) | | 469ps +/-72ps |
| (8) FF PROPAGATION DELAY | | 100ps +/-50ps |
| Total | 1,000ps +/-100ps | 3,569ps +/-1,925ps |

US 8,723,569 B2

SIGNAL RECEIVING CIRCUIT, MEMORY CONTROLLER, PROCESSOR, COMPUTER, AND PHASE CONTROL METHOD

CROSS-REFERENCE TO RELATED APPLICATION

This application is continuation application of International Application PCT/JP2009/071685 filed on Dec. 25, 2009 and designated the U.S., the entire contents of which are incorporated here by reference.

FIELD

The embodiments discussed herein are related to a circuit receiving a signal with a phase variation, an apparatus including the circuit, and a phase control method.

BACKGROUND

A signal receiving circuit receiving a signal with a phase variation includes a signal receiving circuit that receives a signal of DDR memory interface. The DDR (Double Data Rate) memory inputs and outputs data at both of the positive edge and the negative edge of the clock (CK), and transfers data at a data transfer rate twice as fast as the clock frequency.

In such a memory, an internal CK signal generated in the memory controller is transmitted to a DIMM (Dual In-line Memory Module). Based on the CK signal, the DIMM generates a data strobe (DQS) signal, and transmits the DQS signal and data (DQ) signals to the main controller. On the main controller side, a signal receiving circuit receives the DQS signal and the DQ signals. The signal receiving circuit performs retiming on the DQ signals using the DQS signal, and transfers the clock source to an internal clock. In this case, in order to reliably receive the data signals by latch circuits at a receiving point, it is desired that timing relationships between the internal CK signal and the receiving data signals are within a certain range.

With respect to the reception of the signal by the memory controller, it is known that a clock phase different from that of the reference clock is generated and the data strobe signal is delayed (see, for example, Japanese National Publication of International Patent Application No. 2007-536773).

It is known that first and second timings which are the delayed data strobe signal are generated and by selectively using those two timing signals, a signal ambiguous state is avoided (see, for example, Japanese Laid-open Patent Publication No. 2006-107352).

Further, it is known that, in the memory controller, the read data are taken in at a change edge of the data strobe signal (see, for example, Japanese Laid-open Patent Publication No. 11-25029).

Further, it is known that a phase difference between the data strobe signal and the read clock is measured, and by adjusting the delay time of the clock signal using the phase difference to synchronize with the clock signal, the data signal is taken in (see, for example, Japanese Laid-open Patent Publication No. 2008-71018).

SUMMARY

According to one aspect of the present application, a signal receiving circuit disclosed herein includes a phase detection unit and a delay control unit. The phase detection unit detects a phase difference between a received signal and a clock signal. The delay control unit receives the phase difference, delays a phase of the received signal in a range not exceeding a delay amount determined by using a predetermined phase difference as a unit, and changes, when the phase difference exceeds the predetermined phase difference, a delay amount of the received signal by using the predetermined phase difference as a unit.

The object and advantages of the invention will be realized and attained by means of the elements and combinations particularly pointed out in the claims.

It is to be understood that both the foregoing general description and the following detailed description are examples and explanatory and not restrictive of the invention.

BRIEF DESCRIPTION OF DRAWINGS

FIG. 12 is a drawing illustrating logical operations and output statuses in phase comparison;

FIG. 14 is a drawing illustrating phase information;

FIG. 23 is a drawing illustrating a comparative example of a memory controller;

FIG. 24 is a table illustrating calculation examples of delay variation of a circuit;

DESCRIPTION OF THE PREFERRED EMBODIMENTS

In the timing relationship between the internal clock signal and the received data signal, due to an existing delay factor in the LSI (Large Scale Integration) of the memory controller, delay variation may occur in the received signal. Even when the transmission path is, for example, 0 mm, it is known that the delay variation occurs in the received data when viewed from the clock reference of the latch at the receiving point in the LSI. The delay variation may be longer than clock cycle and also longer than the data width (e.g., in a case of 1 GT/s transmission, the data width is 1,000 ps). Due to the delay variation, data transmission may be impaired.

First Embodiment

In the first embodiment, a phase detector detects a phase difference between a received signal and a clock signal. Based on the phase difference, a delay controller sets a delay amount determined by using a predetermined phase difference (reference phase difference) as a unit. In this case, in the delay controller, the phase of the received signal is delayed in a range not exceeding the delay amount. If the phase difference exceeds the predetermined phase difference, the delay controller changes the phase of the received signal by using the delay amount as a unit. The predetermined phase difference is a phase difference determined by using, for example, 90 degrees as a unit. The delay amount is a delay amount determined by using the phase difference as a unit. The term "a range not exceeding the delay amount" refers to a phase delay less than 90 degrees when the delay amount is, for example 90 degrees.

Figure 1:
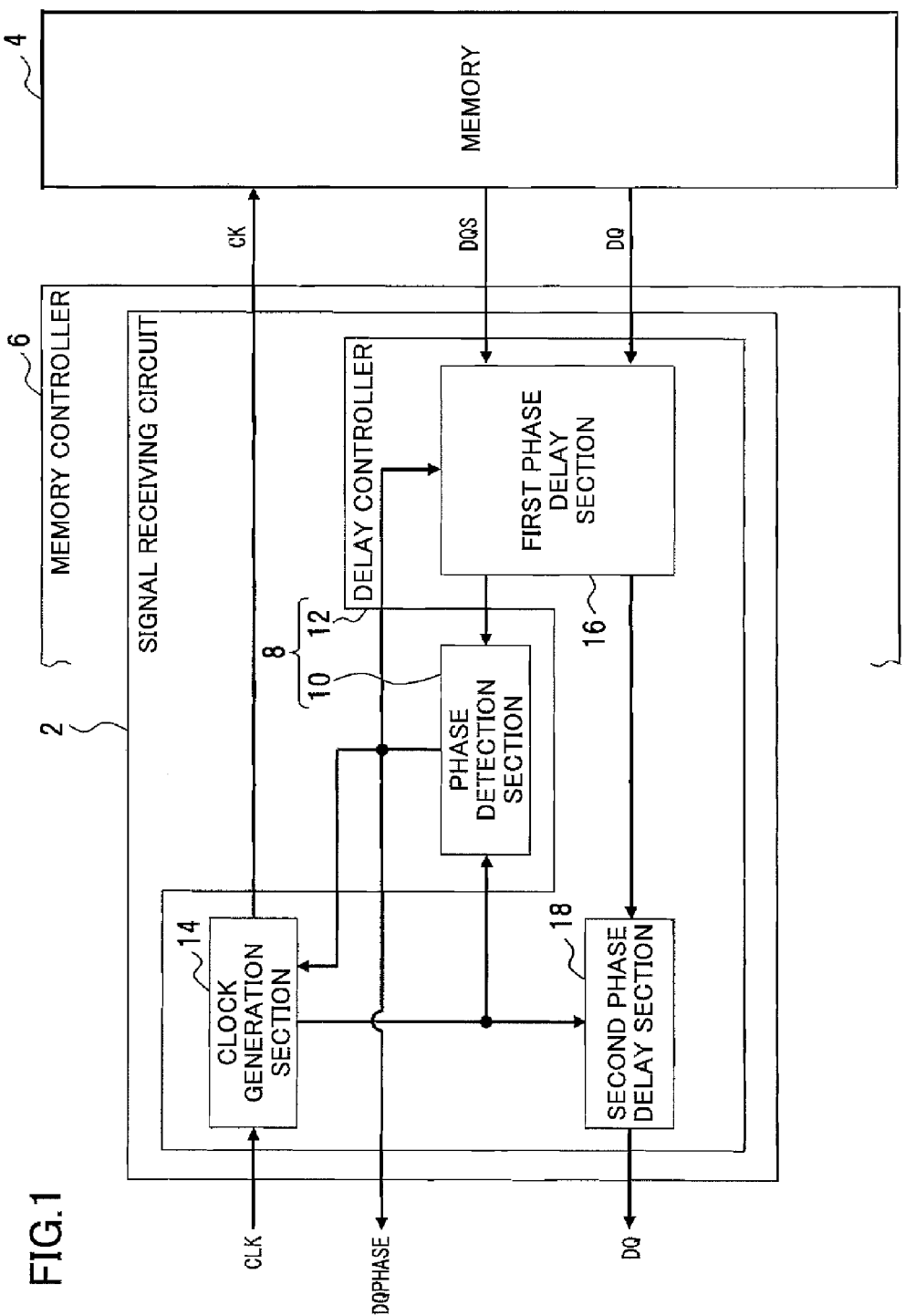
FIG. 1 is a drawing illustrating a memory controller according to a first embodiment.

The first embodiment is described with reference to FIG. 1. FIG. 1 is a drawing illustrating an example of a signal receiving circuit. The configuration illustrated in FIG. 1 is an example only, and the present invention is not limited to the configuration.

A signal receiving circuit 2 is an example of the signal receiving circuit in the present application. In this embodiment, the signal receiving circuit 2 is disposed in a memory controller 6 which is connected to a memory 4, and receives a phase reference signal, a data signal and the like from the memory 4 as the receiving signals. In this case, the memory 4 is a signal source. The memory controller 6 is an interface circuit of the memory 4, serves as an input/output unit of inputting and outputting data, and is formed as an LSI (Large Scale Integration) including the signal receiving circuit 2. Therefore, the memory controller 6 is an example of a memory controller of the present application. The memory 4 is, for example, a DDR SDRAM (Double Data Rate Synchronous Dynamic Random Access Memory). The DDR SDRAM is a memory that transmits data at a rate twice as fast as a clock (CK) signal.

Here, the signal receiving circuit 2 is a means that generates the CK signal based on a reference clock (CK) signal generated by an LSI internal clock circuit section (e.g., a clock tree section 606 in FIG. 23) and receives the phase reference (DQS) signal and the data (DQ) signal generated by a memory 4 that receives the CK signal. The signal receiving circuit 2 includes a phase controller 8 that controls the phases of the DQS signal and the DQ signal. The phase controller 8 includes a phase detection section 10 and a delay controller 12.

Based on the reference CLK signal generated by the LSI internal clock circuit section, the phase detection section 10 compares the CLK signal generated by a clock generation section 14 and the DQS signal having the phase delayed by a first phase delay section 16. Then, the phase detection section 10 detects the phase difference between the signals. The phase difference refers to control information of the phase delay, and is applied to the clock generation section 14. Namely, the phase detection section 10 outputs phase difference information (phase delay information) DQPHASE which indicates the phase difference.

The delay controller 12 receives the phase difference acquired by the phase detection section 10, delays the phase of the DQS signal in a range not exceeding the delay amount determined by using a predetermined phase difference as a unit, and changes the phase of the DQS signal by using the delay amount as a unit. Here, the delay controller 12 includes the clock generation section 14, the first phase delay section 16, and a second phase delay section 18.

For example, the clock generation section 14 is not only a means that receives the reference CLK signal in the system and generates the CL signal described above but also a means that generates, depending on the phase difference, the CLK signals having different phase differences determined by using a predetermined phase difference. For example, as the predetermined phase difference, when 90 degrees are determined as the unit, a divider may be used that divides the CLK signal to generate four CLK signals having the respective phases separated by 90 degrees (each 90 degrees apart).

The first phase delay section 16 receives the DQS signal generated from the memory 4 and the phase difference from the phase detection section 10, and delays the phase of the DQS signal based on the phase difference. Further, the first phase delay section 16 delays the phase of the DQS signal in a range not exceeding the delay amount described above, and delays the phase of the DQ signal in accordance with the phase delay.

On the other hand, the second phase delay section 18 is a phase delay means and a transferring means for transferring an internal clock phase. When the phase difference detected by the phase detection section 10 exceeds the predetermined phase difference, by using the CLK signal from the clock generation section 14, the second phase delay section 18 performs a phase delay on the DQ signal having the phase delayed by the first phase delay section 16, and cause the DQ signal to be synchronized with the CLK signal. By doing this, the DQ signal having optimized phase delay amount may be output.

Figure 2:
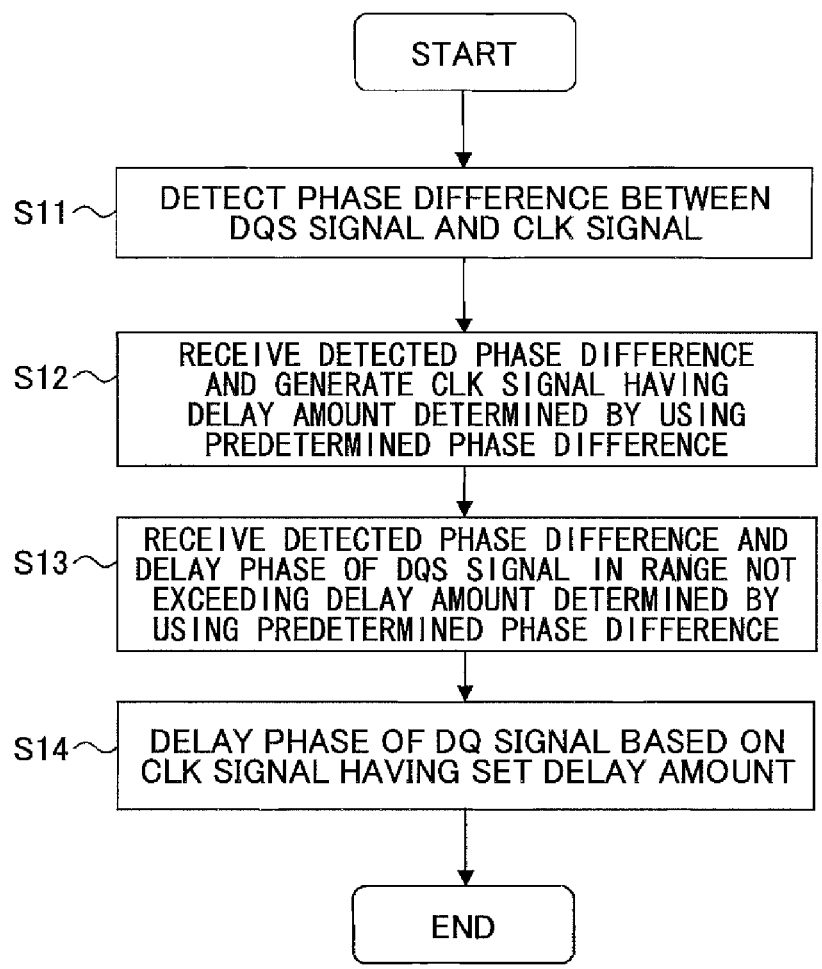
FIG. 2 is a flowchart illustrating an example of a procedure of phased control.

This phase control is described with reference to FIG. 2. FIG. 2 is a flowchart illustrating an example of a procedure of the phase control.

The procedure is an example of a phase control method of the present application, and is executed by the phase controller 8 of the signal receiving circuit 2. The phase control may also be specifically applied to second, third, and any other embodiments of the present application.

As illustrated in FIG. 2, the procedure includes a phase difference detection process (step S11) and a delay control process (steps S12, S13, and S14). In steps S12, S13, and S14, a CLK signal generation process, a first phase delay process, and a second phase delay process are executed, respectively.

As a process prior to the above processes, the memory 4 receives the CK signal from the clock generation section 14 and generates the DQS signal and the DQ signal. The DQS signal and the DQ signal are received by the signal receiving circuit 2.

Here, the phase difference detection process (step S11) is a process that executes a phase difference detection function. In this process, a comparison is made between the DQS signal from the memory 4 and the CLK signal from the clock generation section 14 to detect the phase difference. In this case, the phase difference is output as the phase difference information.

The CLK signal generation process (step S12) is a generation process of generating the CLK signal having the delay amount corresponding to the phase difference. In the process, in accordance with the phase difference, the delay amount is set by using the predetermined phase difference as a unit, a delay amount is set in the CLK signal generated by the clock generation section 14, and the CLK signal having the delay amount is generated (step S12).

The first phase delay process (step S13) is a process of executing a first phase delay function. In this process, based on the phase difference acquired in the phase difference detection process, the phase of the DQS signal is delayed in a range not exceeding the delay amount determined by using the predetermined phase difference as a unit. In this case, when the predetermined phase difference is, for example, set to 90 degrees, the phase of the DQS signal is delayed in the delay amount in a range not exceeding the delay amount of 90 degrees. In this case, the phase of the DQ signal is delayed similarly.

The second phase delay process (step S14) is a process of executing a second phase delay function. In this process, based on the delay amount of a selected CLK signal, the phase of the DQ signal is delayed. In this case, the phase delay of the DQ signal is a delay by determining the predetermined phase (e.g., 90 degrees) as a unit.

By having the configuration, when the phase difference between the DQS signal and the CLK signal corresponds to the phase difference less than 90 degrees, the phase of the DQS signal is delayed based on the first phase delay process. Further, when the phase difference between the DQS signal and the CLK signal corresponds to the phase difference exceeding 90 degrees, the phase of the DQ signal may be delayed based on the delay determined by using 90 degrees of the phase difference as a unit and the delay of the phase difference less than 90 degrees. Therefore, according to this phase delay process, the following advantages may be obtained.

(1) The phase variation of the received DQ signal may be resolved (minimized), and the timings of the DQ signal may be optimized. Further, the configuration in this embodiment may also be applied to a minus delay.

(2) The timings of the DQ signal may be optimized, and the reliability of the data transmission may be improved.

(3) In response to the phase difference between the DQS signal and the CLK signal, the delay determined by using the predetermined phase difference as a unit and the delay corresponding to the phase difference less than the predetermined phase difference are set. The former corresponds to the selection of the CLK signal and the latter corresponds to the delay by the first phase delay section 16. When the phase difference exceeds the predetermined phase difference, based on the former delay and the latter delay, the delay amount is controlled in response to the phase difference. By doing this, the amount of the delay process may be reduced, the circuit scale may be reduced, and the processing speed may be increased.

Second Embodiment

In the second embodiment, plural CLK signals have different phases which are determined by using a predetermined phase difference as a unit. Based on the CLK signals, the delay amount of the DQ signal is set. Further, a data storage is provided that stores DQ signals having the optimized phase delay.

Figure 3:
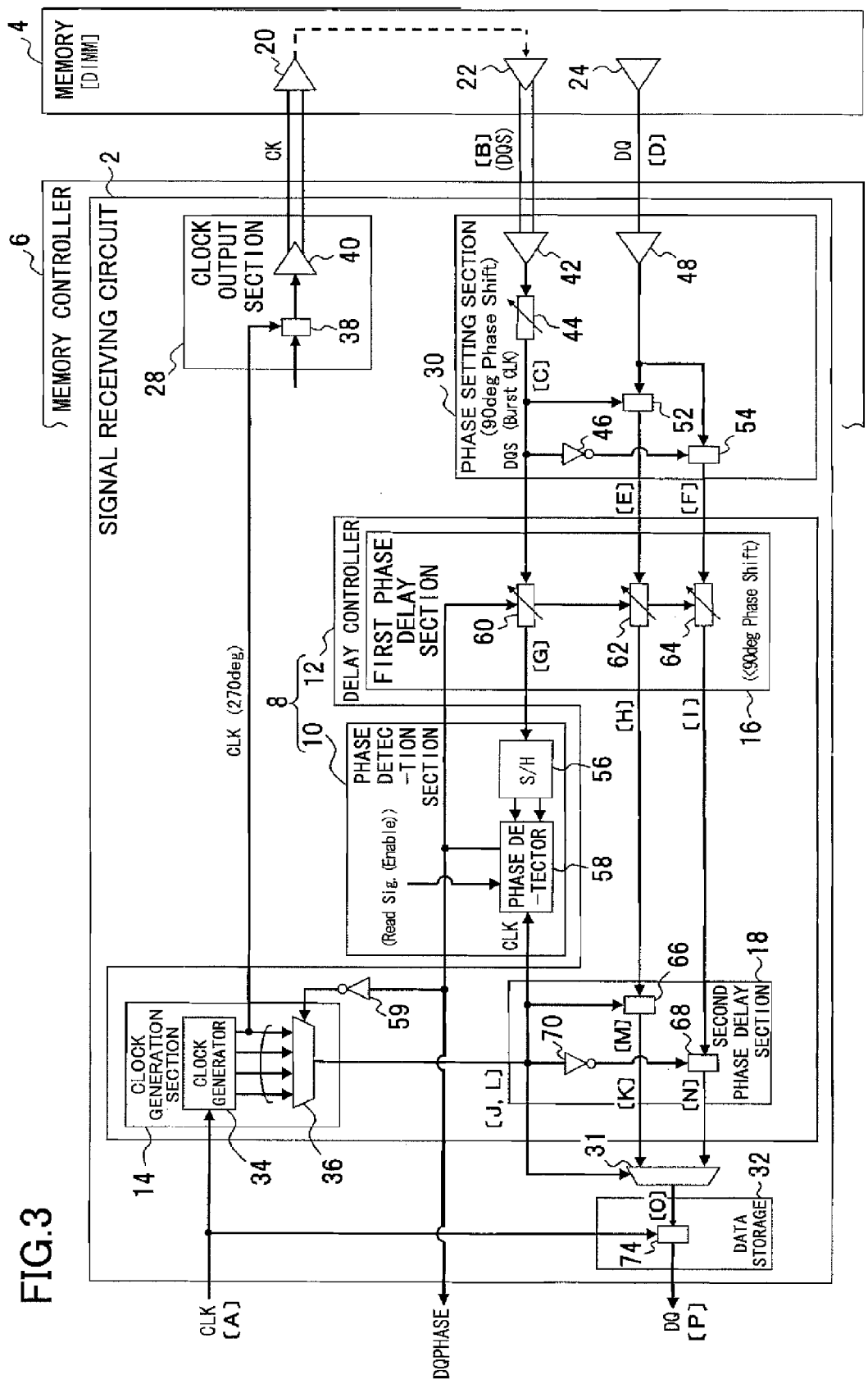
FIG. 3 is a drawing illustrating a signal receiving circuit, a memory controller, and a memory according to a second embodiment.

The second embodiment is described with reference to FIG. 3. FIG. 3 is a drawing illustrating an example configuration including a signal receiving circuit, a memory controller, and a memory. In FIG. 3, the same reference numerals are used to describe the same elements.

The signal receiving circuit 2 is an example of a signal receiving circuit of the present application, and is a receiving means that receives data signals from a signal source such as the memory 4. For example, the memory 4 is configured as the DIMM which is the DDR 3. The memory 4 includes an input buffer 20 and output buffers 22 and 24 in response to the signal receiving circuit 2.

The signal receiving circuit 2 includes the phase detection section 10, the delay controller 12, the clock generation section 14, the first phase delay section 16, the second phase delay section 18, a clock output section 28, a phase setting section 30, a selector 31, and a data storage 32. Further, as described above, the delay controller 12 includes the clock generation section 14, the first phase delay section 16, and the second phase delay section 18.

The clock generation section 14 includes a clock generator 34 and a selector 36. The clock generator 34 is a means that generates CLK signals having plural phases and includes, for example, a clock dividing circuit. When including the clock dividing circuit, the clock generator 34 generates plural CLK signals having the corresponding phases by dividing a CLK signal generated by an LSI internal clock circuit section (e.g., the clock tree section 606 in FIG. 23). In this embodiment, for example, a 2-GHz CLK signal is divided by 4 to obtain 500-MHz CLK signals. Then, four 500-MHz CLK signals having the phases of 0, 90, 180, and 270 degrees are generated.

The clock output section 28 includes a flip-flop (FF) 38 and an output buffer 40. In this embodiment, the clock output section 28 receives a CLK signal having a phase of 270 degrees from the clock generator 34, and outputs the CLK signal to the memory 4. The FF 38 receives the CLK signal. Upon the output from the FF 38, the CK signal is output from the output buffer 40.

When data are read from the memory 4, the memory 4 generates the DQS signal based on the CK signal transmitted from the signal receiving circuit 2 and received by the input buffer 20. The memory 4 further generates the DQ signal which is synchronized with the DQS signal. The output buffer 22 outputs the DQS signal and the output buffer 24 outputs the DQ signal. The DQS signal and the DQ signal are in phase.

The phase setting section 30 is a means that sets a predetermined phase (90 degrees) for the DQS signal and the DQ signal. Here, the phase setting section 30 includes an input buffer 42, a delay circuit (hereinafter may be simplified as "DL") 44, and an inverter 46 on the DQS signal side and an input buffer 48 and FFs 52 and 54 on the DQ signal side.

The DL 44 is a means that performs a 90-degree phase shift on the DQS signal received by the input buffer 42. The DQS signal having passed through the DL 44 is a 500-MHz Burst CLK signal.

The DQ signal received by the input buffer 48 is output via the FF 52 based on the DQS signal and is also output via the FF 54 based on the DQS signal inverted by the inverter 46.

The phase detection section 10 detects the phase difference by making a comparison between the CLK signal generated by the clock generation section 14 and the DQS signal from the first phase delay section 16, and outputs a phase difference determination (DQPHASE) signal as the phase information indicating the phase difference. Here, the phase detection section 10 includes a sample-and-hold (S/H) circuit 56 and a phase detector 58. The S/H circuit 56 performs a sample-and-hold process on the DQS signal having a phase delayed by the first phase delay section 16, and generates two DQS signals for a phase comparison. The phase detector 58 makes a comparison between those DQS signals and the CLK signal to detect the phase difference, and outputs the DQPHASE signal. The DQPHASE signal is an information signal indicating the delay amount of the DQS signal, and is output from the signal receiving circuit 2 as the phase difference information. Further, the DQPHASE signal is applied to the first phase delay section 16, and is inverted by an inverter 59 to be applied to the selector 36 as a selection control signal.

The first phase delay section 16 is not only a means that delays the phase of the DQS signal in a range less than 90 degrees as an example of the delay amount determined by using the predetermined phase difference as a unit but also a means that performs the phase delay on the DQ signal. Here, the first phase delay section 16 includes delay circuits (DL) 60, 62, and 64. The DLs 60, 62, and 64 set variable delay amounts. In this case, the DL 60 receives the DQPHASE signal and sets a delay amount less than 90 degrees, which is the limit value of the delay capability of the DL 60, for the DQS signal.

Further, the DL 62 delays the DQ signal from the FF 52, and the DL 64 delays the DQ signal from the FF 54. The phase delays in this case correspond to the delay amounts less than 90 degrees which is the limit of the delay capability of the DL 62 and 64.

The second phase delay section 18 is not only a means that delays the phase of the DQ signal using the delay amount determined by using the predetermined phase difference (e.g., 90 degrees) as a unit but also a transferring means that transfers from a DQS domain to an internal clock domain. Here, the second phase delay section 18 includes FFs 66 and 68, and an inverter 70. In the second phase delay section 18, a DQ signal is acquired from the FF 66, the DQ signal having the phase delayed by the delay amount described above based on the received CLK signal selected by the selector 36 in response to the inverted signal of the DQPHASE signal. Further, a DQ signal is also acquired from the FF 68, the DQ signal having the phase delayed by the delay amount described above based on the inverted signal of the CLK signal selected by the selector 38 and having been transferred to the internal clock phase.

The selector 31 is a means that selects one of the plural outputs from the second phase delay section 18 in synchronization with the CLK signal. Here, the selector 31 receives a selector output (a selection control signal) from the clock generator 34, and alternately selects the DQ signal from the FF 66 and the DQ signal from the FF 68 by using the four-divided CLK signal which is the output from the selector 36 as the selection information.

The data storage 32 is not only a storage means to store the DQ signals from the FFs 66 and 68 but also a clock transferring means. The data storage 32 includes an FF 74. The FF 74 has a storage function to store the DQ signal and outputs the DQ signal in synchronization with the CLK signal. In this case, the FF 74 outputs the DQ signal selected by the selector 31. Therefore, the FF 74 outputs the DQ signal in synchronization with the CLK signal, and the DQ signal is transferred from the DQS phase absorbing the phase delay to the internal clock phase.

Figure 4:
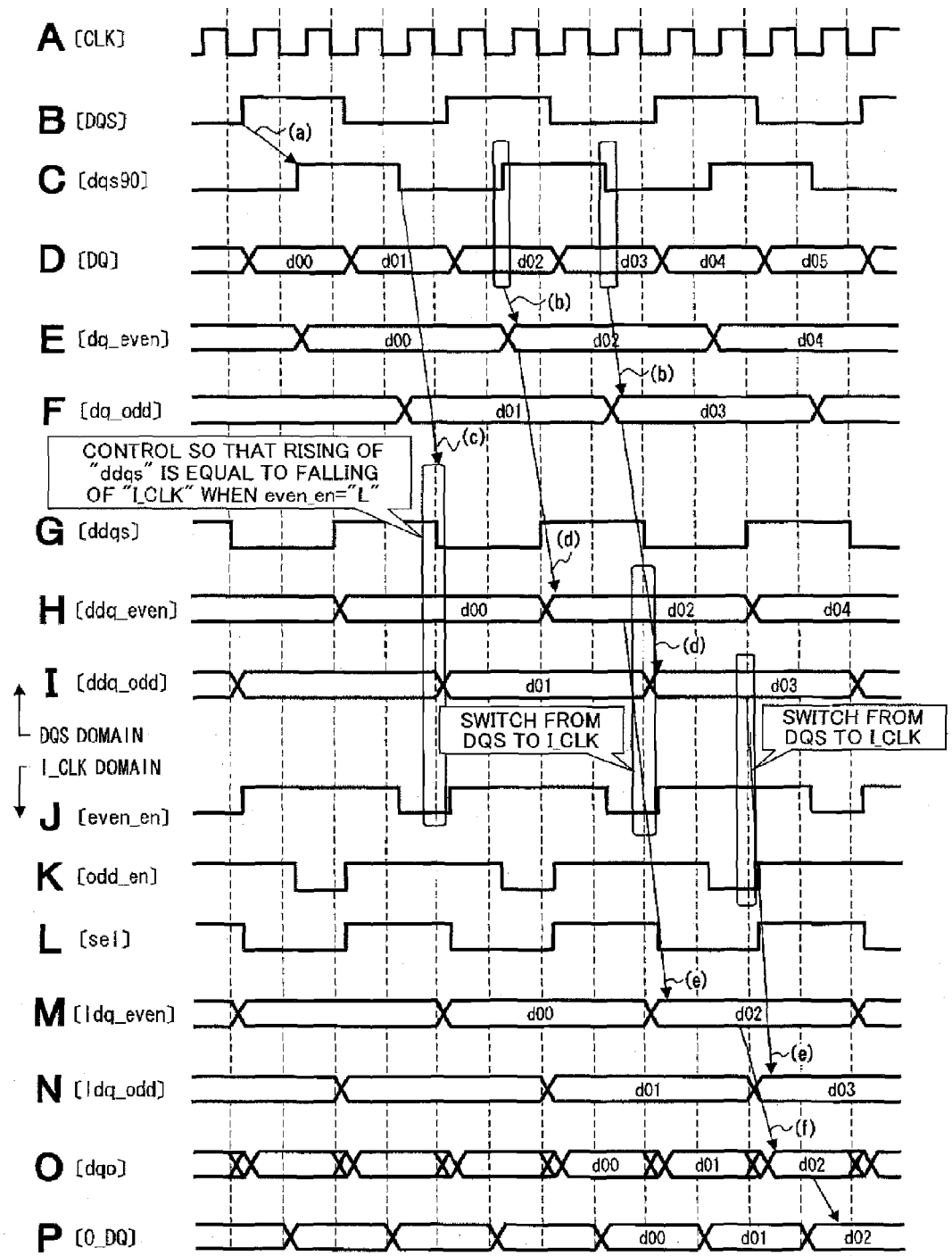
FIG. 4 is a timing chart illustrating a signal receiving operation.
Figure 5:
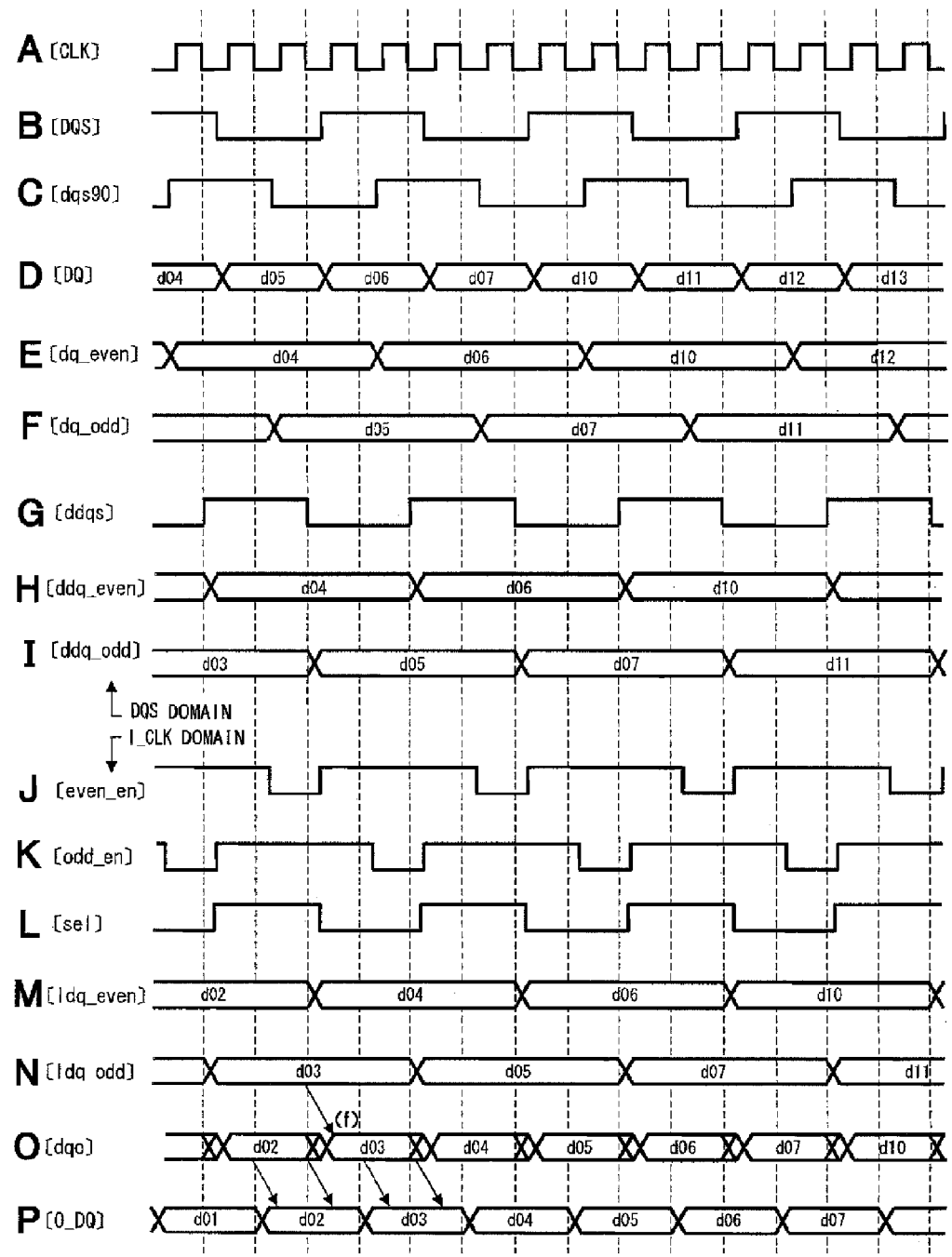
FIG. 5 is a timing chart illustrating the signal receiving operation.

The signal receiving process is described with reference to FIGS. 4 and 5. FIGS. 4 and 5 are timing charts illustrating the receiving operation of the signals. FIG. 5 illustrates a latter half of the timing chart after a former half of the timing chart in FIG. 4.

In FIG. 4 (and FIG. 5), the clocks A through I are in a DQS domain, and the clocks J through P are in an I_CLK domain. To simplify the description, explanation is made with reference to FIG. 4 as a representative figure.

Here, the CLK signal as illustrated in A of FIG. 4 is applied to the clock generator 34, the DQS signal as illustrated in B of FIG. 4 is applied to the buffer 22 of the memory 4, and the DQ signal is acquired in the output buffer 24 of the memory 4. As illustrated in D of FIG. 4, the DQ signal includes data d00, d01, d02, d03, d04, d05, d06, d07, d10, d11, d12, d13, . . . .

On the output side of the DL 44, as illustrated in C of FIG. 4, a signal dqs90 having the phase shifted by 90 degrees from the DQS signal is acquired. In response to this, on the output side of the FF 52, as illustrated in E of FIG. 4, a signal dq_even acquired from the DQ signal is acquired. On the output side of the FF 54, as illustrated in F of FIG. 4, a signal dq_odd is acquired from the DQ signal. The data dq_even includes the data d00, d02, d04, d06, d10, . . . . Further, the signal dq_odd includes the data d01, d03, d05, d07, d11, . . . .

On the output side of the DL 60, as illustrated in G of FIG. 4, a signal ddqs which is a delayed DQS signal is acquired. In response to this, on the output side of the DL 62, as illustrated in H of FIG. 4, a signal ddq even which is a delayed DQ signal is acquired. Further, on the output side of the DL 64, as illustrated in I of FIG. 4, a signal ddq_odd which is a delayed DQ signal is acquired. The signal ddq even includes the data d00, d02, d04, d06, d10, . . . . The signal ddq_odd includes the data d01, d03, d05, d07, d11, . . . .

In the clock generator 34, as illustrated in J of FIG. 4, an even_en signal is acquired from the CLK signal. Further, on the output side of the interver 70, as illustrated in K of FIG. 4, a signal odd_en is acquired from the CLK signal. In response to this, on the output side of the FF 66, as illustrated in M of FIG. 4, a signal Idq_even is acquired. Further, on the output side of the FF 68, as illustrated in N of FIG. 4, a signal Idq_odd is acquired. The signal Idq_even includes the data d00, d02, d04, d06, d10, . . . . The signal Idq_odd includes the data d01, d03, d05, d07, d11, . . . .

To the selector 31, the selection control signal sel (CLK signal) is applied from the clock generator 34 as illustrated in L of FIG. 4. In response to this, from the selector 31, a signal dqo is acquired as illustrated in O of FIG. 4. The signal dqo includes the data d00, d01, d02, d03, d04, d05, d06, d07, d10, . . . .

Further, on the output side of the FF74, as illustrated in P of FIG. 4, an output data signal O_DQ is acquired. This output data signal O_DQ includes the data d00, d01, d02, d03, d04, d05, d06, d07, . . . .

In this timing chart, in a process (a), the phase of the DQS signal is delayed only by 90 degrees. In this case, in response to the positive edge (when the level is transmitted from L level to H level) of the DQS signal (B of FIG. 4), the negative edge (when the level is transmitted from H level to L level) of the signal dqs90 (C of FIG. 4) is generated. In response to this, a process (c) (G, H, I, and J of FIG. 4) is executed.

In a process (b), the DQ signal is acquired at the rising edge and the falling edge of the DQS signal having a phase delayed only by 90 degrees (dqs90). In response to the positive edge of the signal dqs90 (C of FIG. 4) and the data d02 of the DQ signal (D of FIG. 4), by executing the process (b), the data d02 of the signal dq_even (E of FIG. 4) is acquired. On the other hand, as a process (d), the data d02 of the signal ddq_even (H of FIG. 4) is acquired.

A process (c) is executed by the delay controller 12. In the process (c), the delay and the timings are adjusted so that the timing of rising of the signal ddqs which is a delayed DQS signal corresponds to the timing of falling the CLK signal (corresponding to 500 MHz). The delay amount is controlled based on the output of the phase detection section 10 so that the falling edge of the signal ddqs corresponds to the rising edge of the CLK signal when even_en=L.

In a process (d), the same delay as that in the process (c) is applied to the DQ signals (ddq_even, ddq_odd). In response to the negative edge of the signal dqs90 (C of FIG. 4) and the data d03 of the DQ signal (D of FIG. 4), by executing the process (b), the data d03 of the signal dq_odd (F of FIG. 4) is acquired. In response to this, in the process (d), the DQ signal (ddq_even, ddq_odd) is acquired by using the CLK signal. Namely, in the process (d), the data d03 of the signal ddq_odd (I of FIG. 4) is acquired.

In a process (e), the delayed DQ signals (ddq_even, ddq_odd) are acquired by using the CLK signal (i.e., transferring of the CLK signal).

Based on the data d02 of the signal ddq_even (H of FIG. 4), the data d02 of the signal ddq_even (M of FIG. 4) is acquired. In response to the data d03 of the signal ddq_odd (I of FIG. 4), the data d03 of the signal Idq_odd (N of FIG. 4) is acquired. Namely, by the processes of H, I, J, K of FIG. 4, the transferring of the CLK signal is performed on the DQS signal.

In a process (f), the DQ signals (ldq_even, ldq_dd) acquired by using the CLK signal is multiplexed to achieve 1 Gbps. By the data d02 of the signal Idq_even (M of FIG. 4), the data d02 of the signal dqo (O of FIG. 4) is acquired. Further, in response to the data d02, the data d02 of the output dada signal O_DQ (P of FIG. 4) is acquired.

Figure 6:
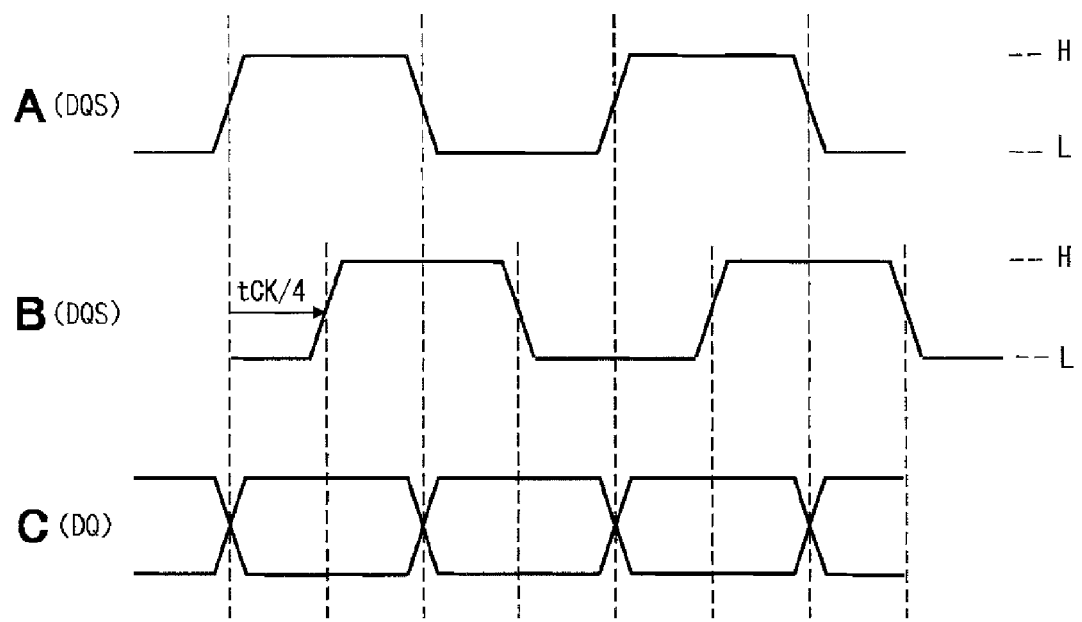
FIG. 6 is a timing chart illustrating timings of received DQS signal and DQ signal.

Next, the acquisition of the DQ signal using the DQS signal is described with reference to FIG. 6. FIG. 6 is a drawing illustrating the timings of the received DQS signal and the DQ signal.

When data are read from the memory 4 {e.g., the DDR 3 memory (DIM)}, the memory 4 generates the DQS signal based on the CK signal received from the signal receiving circuit 2. The DQ signal in synchronization with the DQS signal is output at the DDR (Double Data Rate). In the phase relationship between the DQS signal and the DQ signal, as illustrated in A and C of FIG. 6, the DQS signal changes in accordance with the change of the DQ signal in phase. Due to this, in the signal receiving circuit 2 side, the DQS signal is delayed by tCK/4 (B of FIG. 6) by the DL 44, and the change point of the DQS signal is shifted to the center of the change of the DQ signal. The B of FIG. 6 illustrates a signal having shifted by the tCK/4 from the DQS signal (A of FIG. A). By doing this, the DQ signal is acquired by the signal receiving circuit 2 side by using both edges of the DQS signal.

Figure 7:
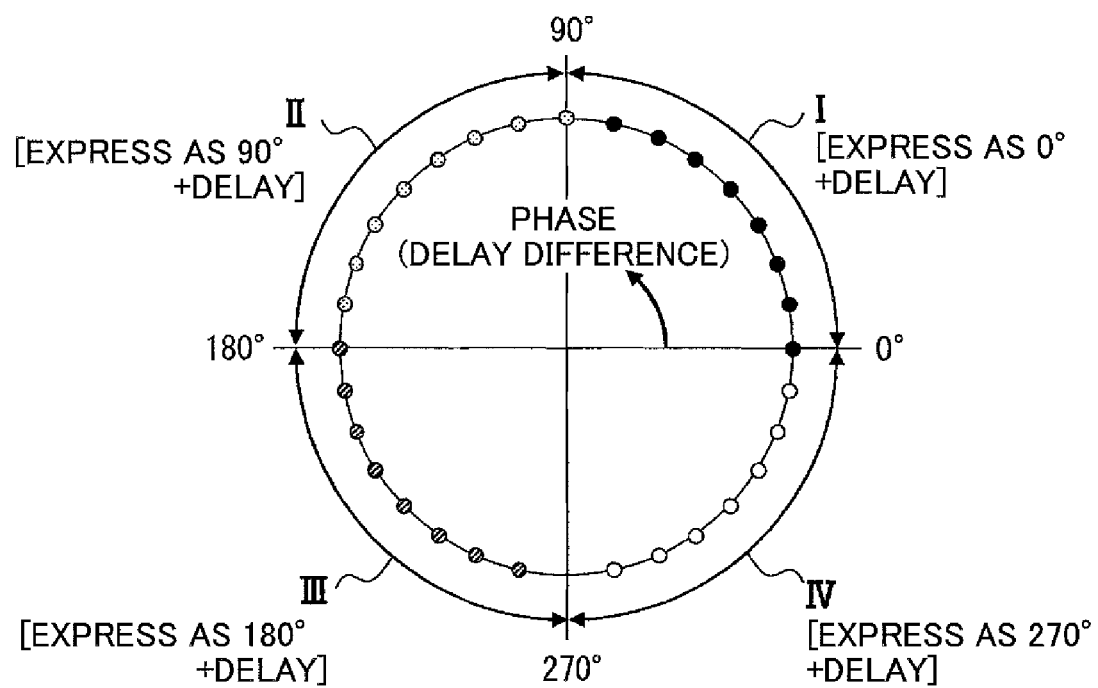
FIG. 7 is a drawing illustrating the phase control.

Next, the transferring of the DQ signal to the internal clock phase is described with FIG. 7. FIG. 7 is a drawing illustrating the phase control.

In the signal receiving circuit 2, a phase comparison is made between the received DQS signal and one of four-phase CLK signals to obtain the phase difference therebetween. The delay process is performed by the DL 60 so that those phases coincide with each other. The delay set by the DL 60 is determined based on the phase difference determination (DQPHASE) signal of the phase detection section 10. The phase detector 58 compares the phases between one of the four-phase CLK signals and the delayed DQS signal based on the DQPHASE signal, and adjusts the delay amount (=DQPHASE) so that the phase of the DQS signal coincides with the phase of the CLK signal.

In this case, when the DQS signal is more delayed than the CLK signal, the delay amount (=DQPHASE) is controlled in the decreasing direction. On the other hand, when the DQS signal is more advanced than the CLK signal, the delay amount (=DQPHASE) is controlled in the increasing direction.

In the DL 60, the maximum delay amount of the phase is less than tCK/4 (=delay difference between phases of the four-phase CLK signals). Therefore, when a delay greater than or equal to the maximum delay amount is desired, the selected one of the four-phase CLK signals is shifted to the one of the four-phase CLK signals having a phase which is advanced by one phase. By doing this, the delay amount of the DL 60 is minimized and the phase comparison is made. Further, if it is desired to obtain greater delay, the delay amount of the DL 60 may be increased again.

In this case, the delay amount of the DL 60 reaches the maximum delay amount (the limit of variable delay amount) again, and the selected one of the four-phase CLK signals is further shifted to the one of the four-phase CLK signals having a phase which is advanced by one phase. The point is that the delay control of shifting to one of the four-phase CLK signals by one phase is repeated until the delay of the DL 60 is less than the maximum delay amount.

In the delay control, for example, when the current delay difference is 40 degrees, the phase delay is performed based on the CLK signal having a 0-degree phase and the delay corresponding to 40 degrees. When the delay gradually increases, the delay amount of the DL 60 may accordingly increase. In this case, when the delay becomes 90 degrees, the DL 60 alone may not realize the delay. Therefore, the CLK signal (having a 0-degree phase) is switched to the CLK signal having a 270-degree (i.e., −90-degree) phase. Then, the delay of the DL 60 is set to zero. Here, in FIG. 7, the region I indicates control in a range equal to or greater than 0 degrees and less than 90 degrees (black circles). The region II indicates control in a range equal to or greater than 90 degrees and less than 180 degrees (circles including spots). The region III indicates control in a range equal to or greater than 180 degrees and less than 270 degrees (circles including hatched lines). The region IV indicates control in a range equal to or greater than 270 degrees and less than 360 degrees (0 degrees) (circles).

Figure 8:
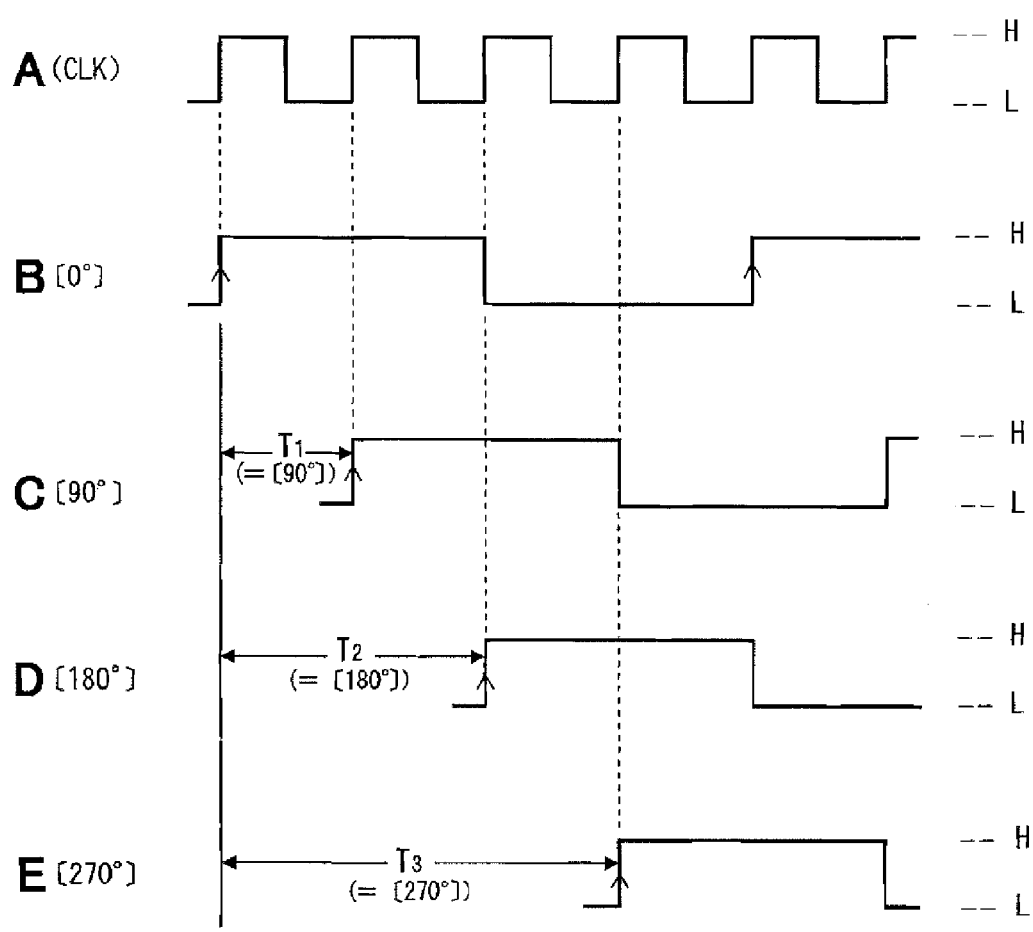
FIG. 8 is a timing chart illustrating a generation of multiphase clock signals.

Next, the generation of the four-phase CLK signals is described with reference to FIG. 8. FIG. 8 is a timing chart illustrating the generation of the four-phase CLK signals.

The four-phase CLK signals are generated by the clock generator 34 based on a reference CLK signal. In a case where the clock generator 34 is configured by a dividing circuit, when a CLK signal as illustrated in A of FIG. 8 is given, the CLK signal is divided to generate the CLK signal having a 0-degree phase difference as illustrated in B of FIG. 8. By using the CLK signal having the 0-degree phase difference, other CLK signals having the predetermined phase differences as illustrated in C, D, and E of FIG. 8 are generated. The clock C of FIG. 8 is the CLK signal having a 90-degree phase difference delayed from the CLK signal having the 0-degree phase difference by time $T_1$. The clock D of FIG. 8 is the CLK signal having a 180-degree phase difference delayed from the CLK signal having the 0-degree phase difference by time $T_2$. The clock E of FIG. 8 is the CLK signal having a 270-degree phase difference delayed from the CLK signal having the 0-degree phase difference by time $T_3$.

Figure 9:
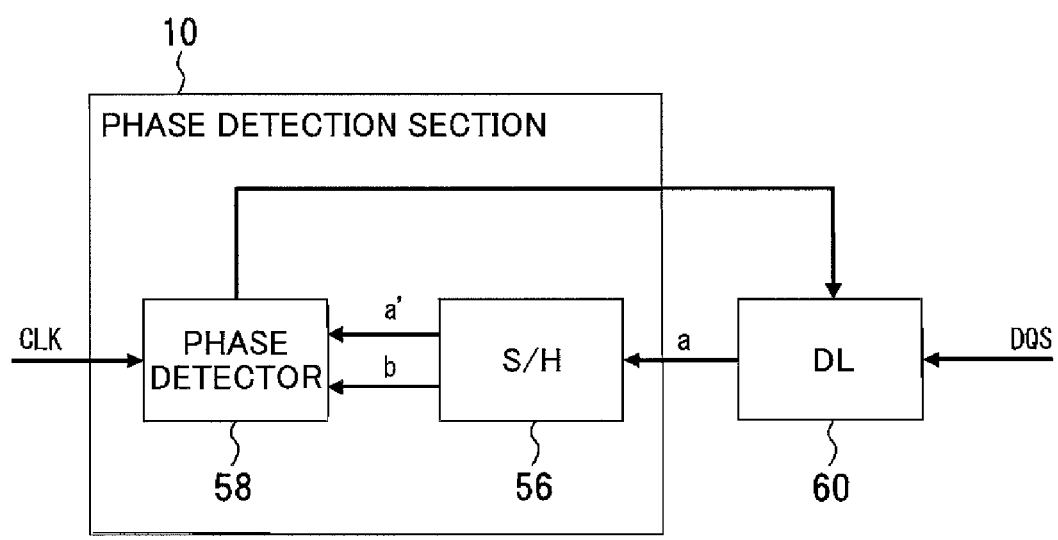
FIG. 9 is a drawing illustrating an example phase detector.
Figure 10:
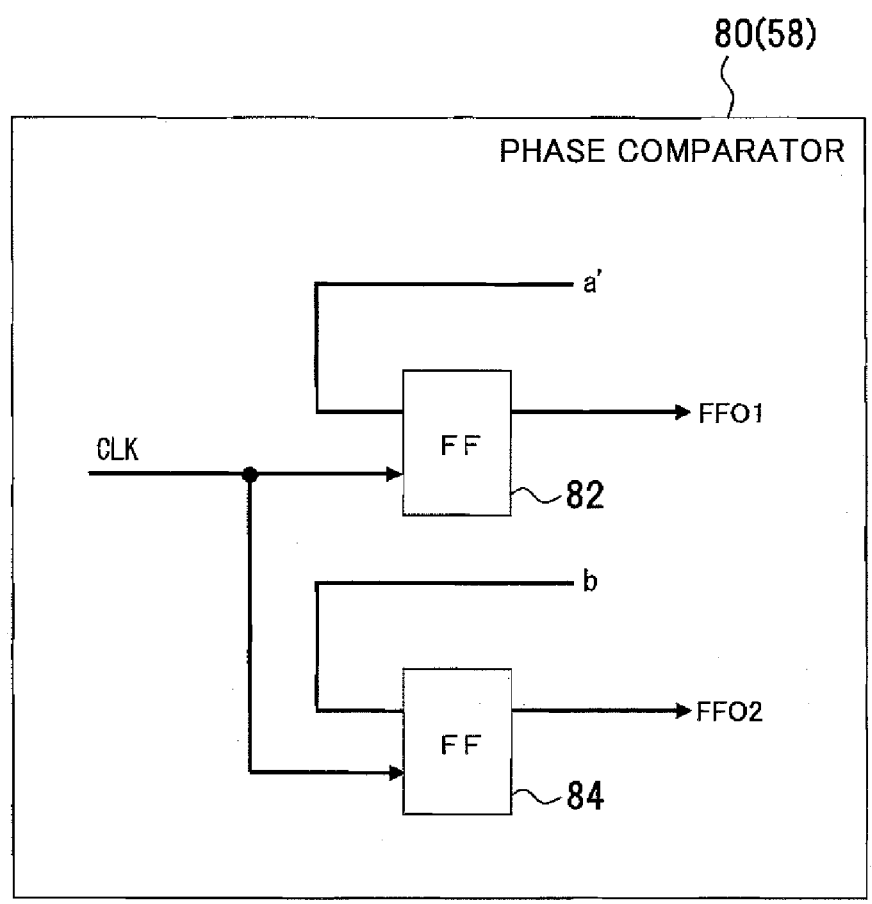
FIG. 10 is a drawing illustrating an example phase comparator.
Figure 11:
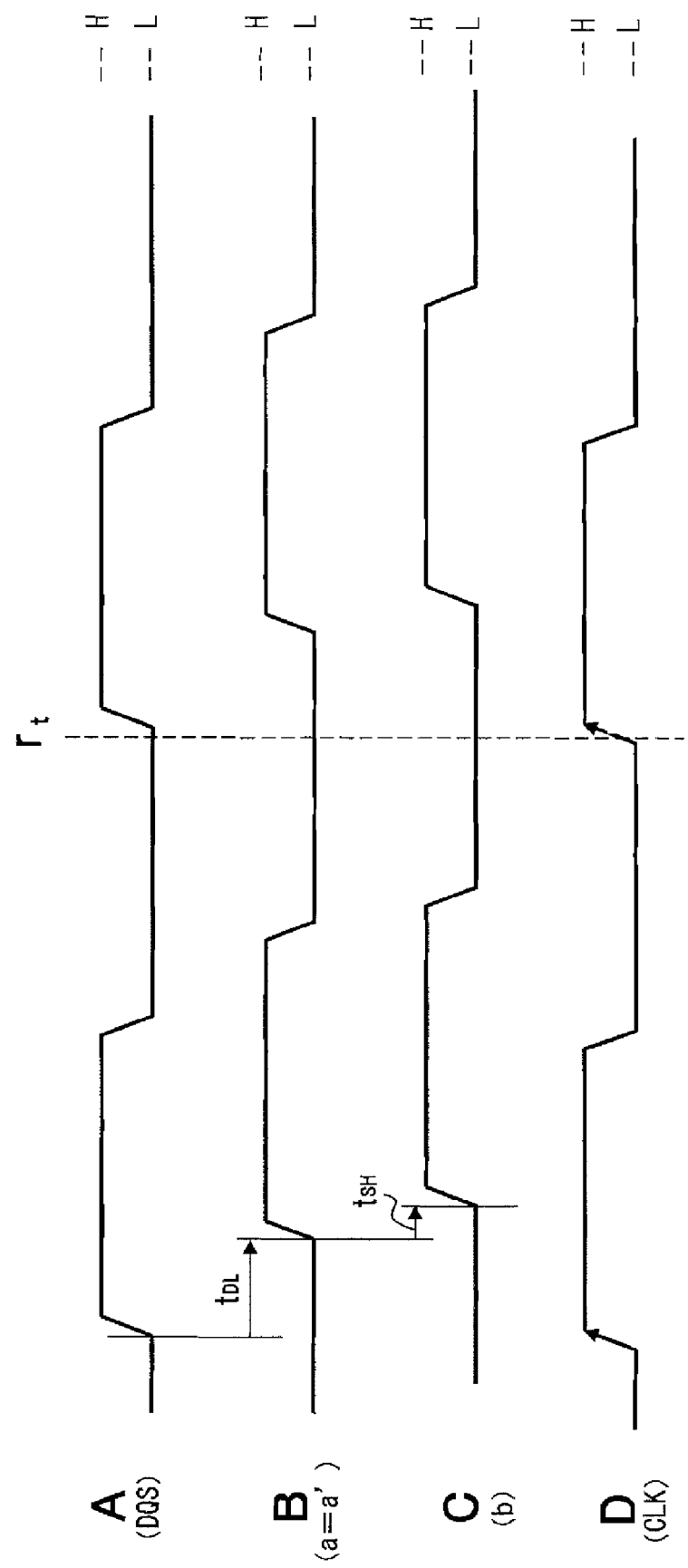
FIG. 11 is a timing chart illustrating a phase comparison operation.

Next, the phase detection section 10 is described with reference to FIGS. 9, 10, 11, and 12. FIG. 9 illustrates an example of the phase detection section 10. FIG. 10 illustrates an example of a phase comparator. FIG. 11 illustrates a phase detecting operation, and FIG. 12 illustrates the logical operations and output statuses in the phase comparison.

As described above, the phase detection section 10 includes the S/H circuit 56 and the phase detector 58. Upon the receipt of the DQS signal delayed by the DL 60 (here, it is assumed that the DQS signal is given as a signal a), the S/H circuit 56 generates a signal a' and a signal b. Here, the signal a' is substantially equivalent to the signal a, and the signal b has a phase slightly delayed (slight delay) from the phase of the signal a. The phase detector 58 detects the phase of the CLK signal based on the two signals a' and b having different phases.

The phase detector 58 includes a phase comparator 80. As illustrated in FIG. 10, the phase comparator 80 includes a first FF 82 and a second FF 84. The CLK signal is commonly input to each of the FF 82 and the FF 84. Further, the signal a' and the signal b are input to the FF 82 and the FF 84, respectively.

FIG. 11 illustrates the DQS signal (A), the signal a' (=a) (B), the signal b (C), and the CLK signal (D). The signal a' (=a) (B) is delayed from the DQS signal (A) by $t_{DL}$ generated by the DL 60. Relative to the signal a' (=a) (B), the signal b (C) is slightly delayed by $t_{SH}$ (slight delay). Further, the dotted line $r_t$ denotes a comparison reference position.

When those DQS signal, signals a' and b, and the CLK signal are input to the phase comparator 80, as illustrated in FIG. 12, delay information of the phase is acquired based on the states of the output FFO1 of the FF82 and the output FFO2 of the FF 84.

The delay information of the phase indicates an overdelay state (to advance the phase of the DQS) when 1) the output FFO1=L, and the output FFO2=L, an opposite 180-degree delay state when 2) the output FFO1=L, and the output FFO2=H, an appropriate delay (OK) state when 3) the output FFO1=H, and the output FFO2=L, and an insufficient delay state (to delay the phase of the DQS) when 4) the output FFO1=H, and the output FFO2=H.

Figure 13:
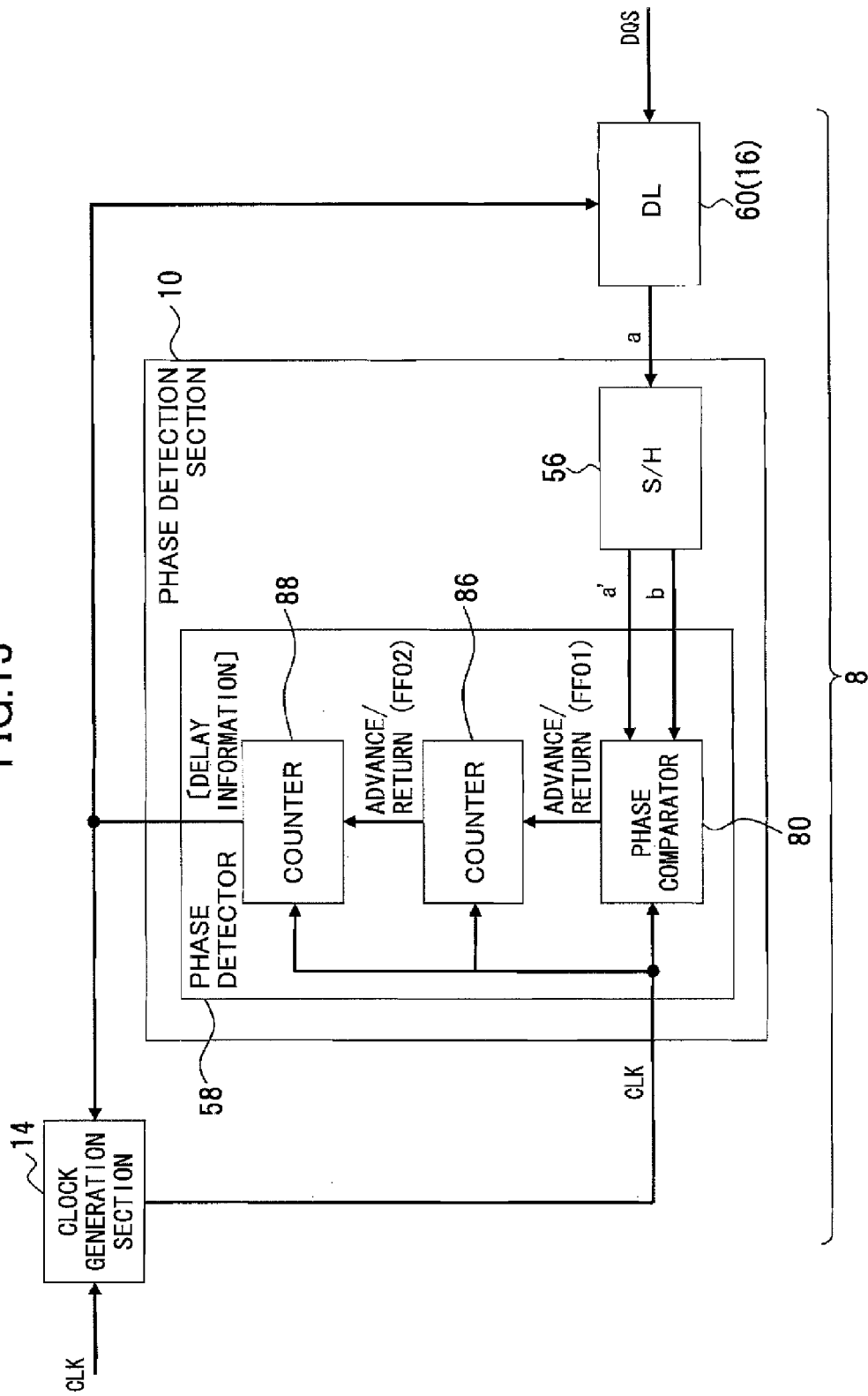
FIG. 13 is a drawing illustrating an example phase detector.
Figure 15:
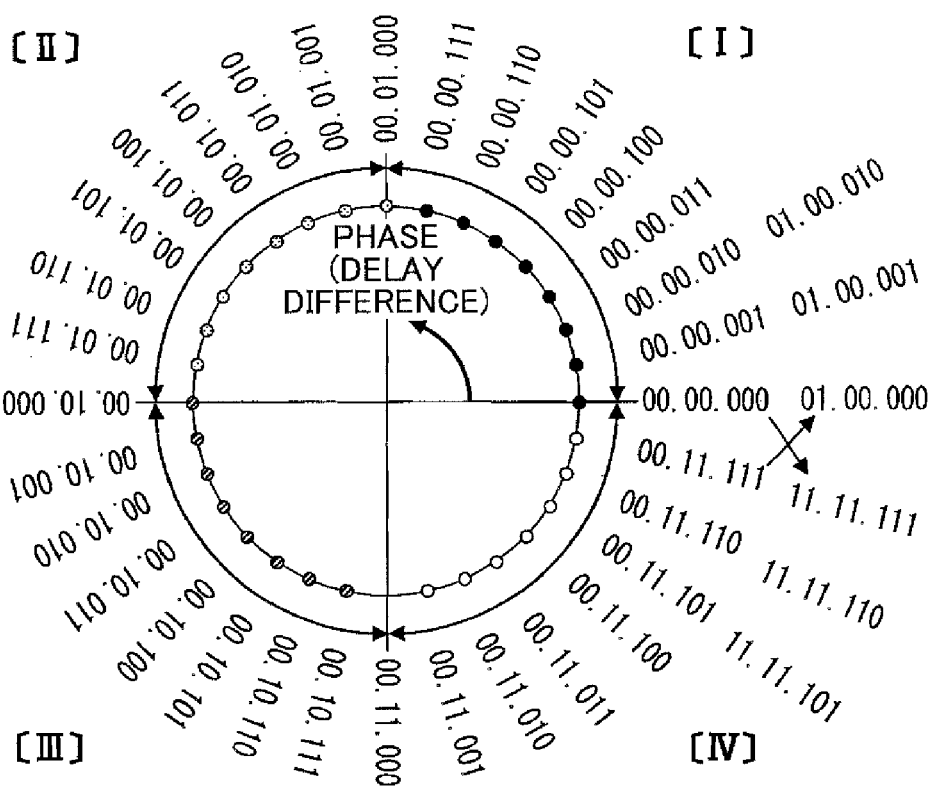
FIG. 15 is a drawing illustrating phase control.

Next, the phase detection section 10 is described with reference to FIGS. 13, 14, and 15. FIG. 13 illustrates an example of the phase detection section 10. FIG. 14 illustrates an example of the delay information. FIG. 15 is a drawing in which the phases are expressed by the delay information. In FIG. 13, the same reference numerals are used to describe the same elements in FIGS. 3 and 9.

As illustrated in FIG. 13, the phase detection section 10 includes the S/H circuit 56 and the phase detector 58. The phase detector 58 includes the phase comparator 80, a first counter 86, and a second counter 88.

The S/H circuit 56 generates the signal a' and the signal b based on the signal a (i.e., the DQS signal) from the DL 60. The phase comparator 80 compares between the CLK signal and the signals a' and b, and acquires the outputs of the FFO1 and FFO2 (FIGS. 10 and 12). The outputs of the FFO1 and FFO2 constitute the delay information of the phase as illustrated in FIG. 13. The delay information may be represented by, for example, 7-bit digital information (i.e., seven digits of binary) as illustrated in FIG. 14.

In the delay information, the last three digits (3 bits) denotes delay control information relative to the DL 60, which is delay adjustment information less than 90 degrees in this embodiment. The middle two digits (2 bits) denote CLK selection information relative to the clock generation section 14, which is delay amount selection information determined by using a predetermined phase difference (=90 degrees) as a unit in this embodiment. Further, the first two digits (2 bits) denotes the circulated number (i.e., how many times the phase rounds). It is the clock selection information relative to the clock generation section 14 and the delay amount selection information determined by using a predetermined phase difference (=90 degrees) as a unit in this embodiment.

Here, in the phase control, the S/H circuit 56 generates the signal a and the signal b. The signal a is slightly delayed from the DQS signal. The signal b is further slightly delay from the signal a. The phase detector 58 determines the phase of the DQS signal based on the comparison between the signals a' and b and the CLK signal. The first counter 86 is an integral means that integrates the detected phase signal based on the output of the phase detection by the phase comparator 80. The integration of the phase signal is to avoid a malfunction.

Here, the first counter 86 counts the phase signal (i.e., the output of the phase comparator 80), and the counted value is added to the second counter 88. When the counted value of the first counter 86 exceeds a predetermined value (threshold value), the counted value of the second counter 88 is accordingly increased or decreased and the counted value of the first counter 86 is reset. There may be cases where the counted value of the first counter 86 exceeds the threshold value to the plus side and to the minus side. When the counted value of the first counter 86 exceeds the threshold value to the plus side, the counted value of the second counter 88 is increased. On the other hand, when the counted value of the first counter 86 exceeds the threshold value to the minus side, the counted value of the second counter 88 is decreased.

The output of the second counter 88 denotes the delay information (FIG. 14). The delay information is used for the delay control of the DL 60 and the CLK selection of the clock generation section 14 (i.e., the phase change).

As illustrated in FIG. 14, the delay information is assumed to have a digital amount having an arbitrary bit length and the initial value is, for example, "0000000". Here, the DL 60 determines the delay applied to signals passing therethrough based on the last three bits of the delay information. In this embodiment, one of the delays is obtained by equally dividing a 90-degree phase into eight phases ((0, . . . , ⅞)×90 degrees). Those phase angles are expressed at the black circles, the circles including spots, the circles including hatched lines, and the circles as illustrated in FIG. 15. FIG. 15 illustrates a case where the phases are expressed by the delay information.

In this case, 360 degrees (one cycle) are equally divided by 32. Therefore, in FIG. 15, the delay information in the first quadrant (I) is expressed as xx00xxx. Similarly, the delay information in the second quadrant (II) is expressed as xx01xxx, the delay information in the third quadrant (III) is expressed as xx10xxx, and the delay information in the fourth quadrant (IV) is expressed as xx11xxx. Then, when the delay rounds n times, the last 5 bits become the same.

Further, in the selection of the CLK signal, the data of the last 5 and 4 bits (i.e., the middle 2 bits) are used to select the CLK having the phase to be selected.

Here, if the DL 60 has an endless delay line, the phase may be adjusted by the DL 60 alone. However, it is not possible, and the length is limited. Therefore, the phase may not be adjusted by the delay circuit alone. Further, the delay circuit may add the delay but may not provide a minus delay.

Here, in the phase adjustment, when the delay is adjusted based on accuracy where 90 degrees are equally divided by 8 (i.e., 360 degrees are equally divided by 32), the last 3 bits of the phase delay information (FIG. 14) indicate the adjustment amount less than 90 degrees. Further, the middle 2 bits provide the information which phase is used when 90 degrees is used as a unit. Therefore, this information is used to select the CLK signal having the phase delay determined by using the 90 degrees as a unit. Further, the first (upper) 2 bits provide a signal indicating how many times the phase rounds. Therefore, the phase following (allowable) range may be determined depending on the number of bits of the delay information.

In the phase adjustment described above, the delay adjustment by the DL 60 and the phase selection of the CLK signal may be used. Therefore, the degree of freedom of the phase adjustment of the DQ signal may be increased. Specifically, both the minus delay and an excessive phase delay may be virtually realized. Therefore, when compared with a case where the delay is adjusted by the DL 60 alone, the following advantages may be obtained.

a) DL 60 may become larger in proportion to the delay amount. However, in the above configuration using the selection of the CLK signal, the entire circuit scale may be reduced.

b) By just increasing the number of bits of the counters 86 and 88, a considerably large (theoretically unlimited) range of delay may be supported.

c) The minus delay may be supported. When only the DL 60 is used, it may be desired to prepare an offset delay in response to a minimum value. However, in the above configuration using the selection of the CLK signal, such an offset delay may not be necessary.

Figure 16:
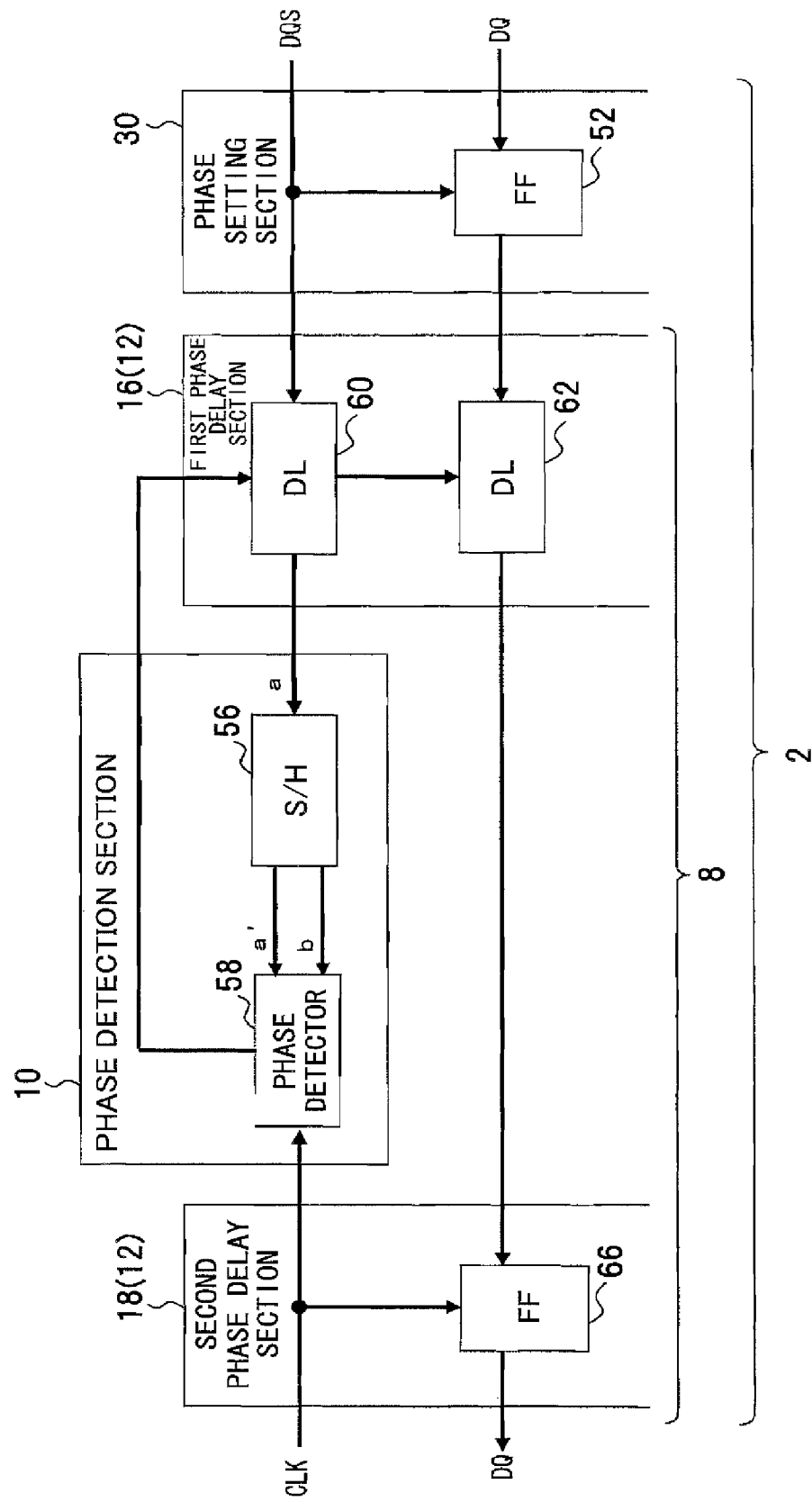
FIG. 16 is a drawing illustrating a clock switching operation.
Figure 17:
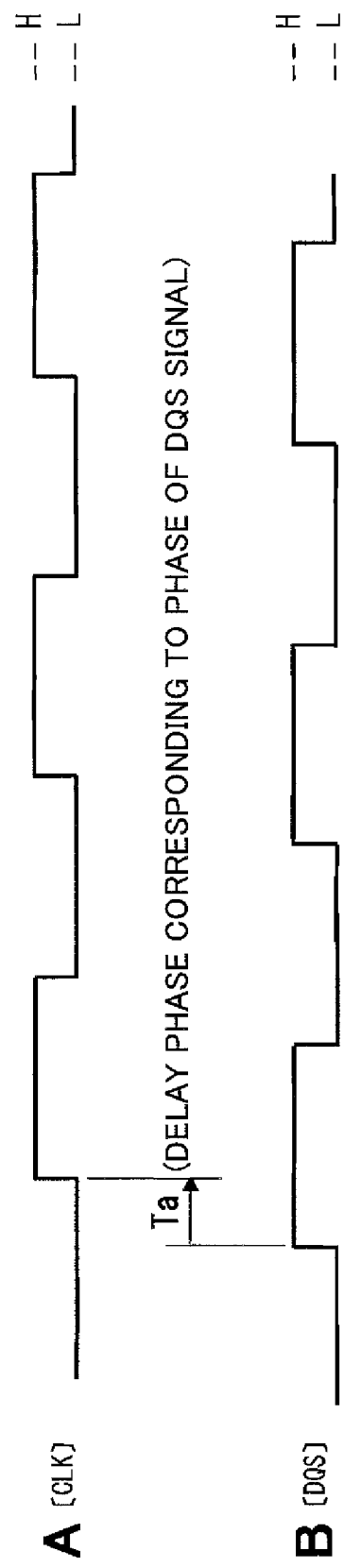
FIG. 17 is a timing chart illustrating an example of the clock switching operation.
Figure 18:
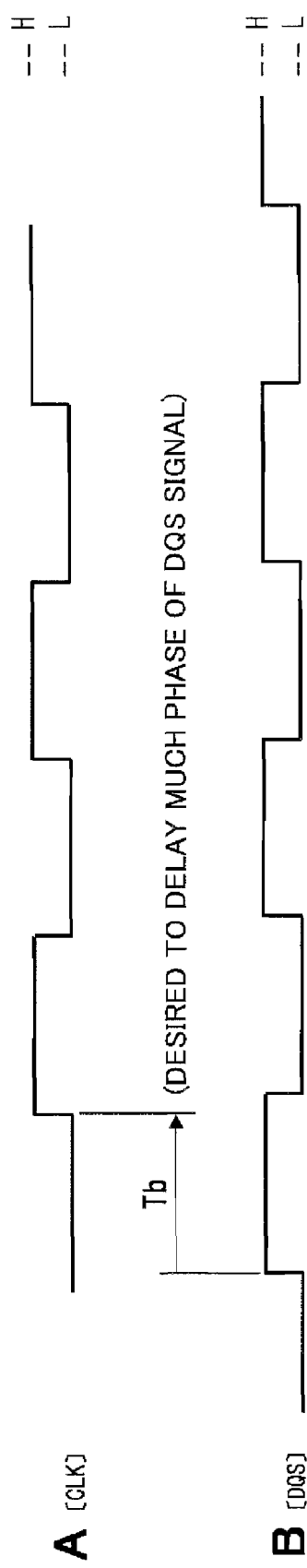
FIG. 18 is a timing chart illustrating another example of the clock switching operation.
Figure 19:
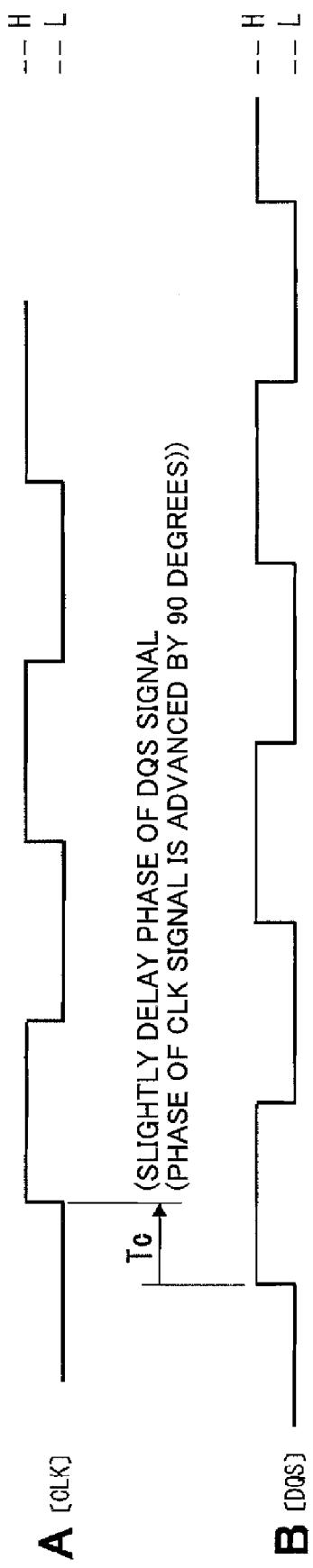
FIG. 19 is a timing chart illustrating another example of the clock switching operation.

Next, the transferring of the clock is described with reference to FIGS. 16, 17, 18, and 19. FIG. 16 is a drawing illustrating a clock transferring operation. FIGS. 17, 18, and 19 are timing charts illustrating an example of the clock transferring operation. In FIG. 16, the same reference numerals are used to describe the same elements of FIG. 3.

In the phase controller 8, to describe the clock transferring, as illustrated in FIG. 16, along with the phase detection section 10 and the first phase delay section 16 and the second phase delay section 18 of the delay controller 12, a phase setting section 30 is extracted. Namely, the phase detection section 10 is extracted from the signal receiving circuit 2, and the FF 52, the DLs 60 and 62, and the FF 66 are extracted from the phase setting section 30, the first phase delay section 16, and the second phase delay section 18, respectively.

In this case, when the DQ signal (data) is propagated from the FF 52 to the FF 66, the phase of the DQS signal may vary. In response to the phase variation, the phase delay (phase compensation) is performed on the phase relationship between the CLK (DQS) of FF 52 and the CLK of FF 62 by using the DL 60. However, the DL 60 and 62 becomes larger accordingly. Therefore, by not only the phase adjustment but also the change of the phase of the CLK signal set on the FF 66 side, the phase control for the clock transferring is performed. Namely, when the phase difference is greater than (or equal to) 90 degrees, the phase of the CLK signal is changed by using 90 degrees as a unit. Further, when the phase difference is less than 90 degrees, the phase is adjusted by the DL 60 (alone). In this case, the phase adjustment using 90 degrees as a unit is controlled in the opposite direction (direction to advance the phase) of the CLK signal, and when the value of the delay amount is equivalently increased, the phase of the CLK signal is advanced.

In the phase adjustment, FIG. 17 illustrates a case where the phase of the DQS signal (B of FIG. 17) is slightly (i.e., less than 90 degrees) advanced from the CLK signal (A of FIG. 17). In this case, the phase of the DQS signal may be delayed based on the phase difference Ta (<90 degrees) between the DQS signal and the CLK signal by using the DL 60. In this case, the phase of the DQ signal is similarly adjusted by the DL 62.

As illustrated in FIG. 18, in a case where the phase of the DQS signal (B of FIG. 18) is greatly advanced (i.e., the phase difference Tb>90 degrees) from the CLK signal (A of FIG. 18), it is desired to further delay the phase of the DQS signal. In this case, both the delay by the DL 60 and the selection of the CLK signal are used at the same time.

In this case, as illustrated in FIG. 19, by switching to the CLK signal (A of FIG. 19) having the phase advanced by 90 degrees, the phase difference between the CLK signal (A of FIG. 19) and the DQS signal (B of FIG. 19) is reduced to a slight phase difference. When the phase difference Tc is less than 90 degrees (Tc<90 degrees), the phase of the DQS may be delayed in accordance with the phase difference Tc by using the DL 60. In this case, the phase of the DQ signal is adjusted by the change of the CLK signal and the DL 62 as well. As a result, the phase control in response to the phase delay may be performed and the timing of the data signal may be optimized.

The features and the advantages in the above embodiment may be described as in the following list.

(1) In the above embodiment, the signal receiving circuit 2 of the memory controller 6 includes the phase detection section 10 and the delay controller 12. The delay controller 12 includes the clock generator 34 which generates the CLK signals having four phases, the degrees being a predetermined degrees apart, as the CLK signals having plural phases generated from the CLK signal. The phase detection section 10 includes the phase detector 58 which acquires the phase difference based on the comparison between the DQS signal generated from the memory 4 and the CLK signal on which the delay process is performed.

(2) In the above embodiment, the delay may be determined in accordance with the change in the signal by using the delay amount of the DL 60 and the phase selection of the CLK signal from the four-phase CLK signals. Specifically, the delay may respond to the change in the signal in accordance with the number of bits of the counters 86 and 88 generating and storing the delay information (DQPHASE).

(3) When the delay amount is decreased, the delay amount of the DL 60 is decreased. However, the delay may not be less than 0 degrees. In this case, by selecting the CLK signal having the phase advanced by one phase from the four-phase CLK signals and maximizing the delay amount (i.e., the delay difference between phases of the four-phase CLK signals) of the DL 60, a similar effect may be obtained.

(4) Therefore, in the signal receiving circuit 2, the phase of the DQ signal (data) may be transferred from the DQS phase to the internal clock phase while maintaining the change phase of the DQS signal and the clock phase in the signal receiving circuit 2 at the optimum states. Further, a desired delay amount (i.e., the phase difference amount) for transferring the phase may be acquired as the delay information, and the delay information may be output.

(5) In the signal receiving circuit 2, the buffers (⅜₃₂ tck) for the delay and the clock generator 34 generating the wavelength having four different phases may be used. Further, in the signal receiving circuit 2, it may become possible to respond to the variation in the arriving time (e.g., variation due to the temperature) when the speed up of the DQ signal from the memory 4 occurs and report the delay information indicating the delay time and the like to an upper-level circuit such as a processor. In the above circuit, the delay information may be used in the design and the control of the memory controller 6. Further, the clock generator 34 is used. Therefore, the delay time may be measured with a small buffer.

(6) The signal receiving circuit 2 includes the phase detection section 10 as the phase controller 8 and the delay controller 12. Further, the phase detection section 10 includes the phase comparator 80 that makes a comparison between the phase reference signal (DQS) of the input data and the internal reference clock. The phase detection section 10 determines the delay amount (DQPHASE) of the DQS signal based on the difference from the CLK signal, and outputs the delay amount (DQPHASE). The first phase delay section 16 receives the output signal from the phase detection section 10, and includes the DL 60 as a variable delay means to change the delay amount of the phase reference signal (DQS) of the input data. Further, the first phase delay section 16 receives the output signal from the phase detection section 10, and includes the DL 62 and 64 as a variable delay means to change the delay amount of the received data. Further, the delay controller 12 includes the clock generation section 14 which receives the output signal of the phase detection section 10, and switches that phase of the divided output. Specifically, the clock generator 34 includes, for example, a divider, and generates the four-phase CLK signals. As a selection means to select one of the four-phase CLK signals, the selector 36 is provided. To the selector 36, the delay information is applied from the phase detection section 10 as the selection information. As a result, the selector 36 selects one CLK signal adapted to the delay amount from the four-phase CLK signals, and outputs the selected CLK signal. Further, the signal receiving circuit 2 includes the data storage 32. The data storage 32 includes, for example, the FF 74 that acquires and stores the output data of the signal receiving circuit 2.

(7) The S/H circuit 56 may be a variable delay device.
(8) The delay amount (DQPHASE) is output as the digital amount.
(9) The clock generator 34 includes a divider, and the dividing ratio set in the divider is $2^n$ (n is 1 or a natural number greater than 1).
(10) The DL 44, 50, 60, 62, and 64 may be phase delay circuits rather than the delay circuits.

Third Embodiment

In the third embodiment, as the delay information (DQPHASE) acquired based on the phase difference, first phase information (dqphase1) and second phase information (dqphase2) are used. In this case, the first phase information (dqphase1) is the delay amount determined by using a predetermined phase difference as a unit, and is the delay amount changed by the 90 degrees to change the phase of the phase reference signal. Further, the second phase information (dqphase2) is the delay amount to delay the phase of the phase reference signal in a range not exceeding the delay amount determined by using a predetermined phase difference as a unit.

Figure 20:
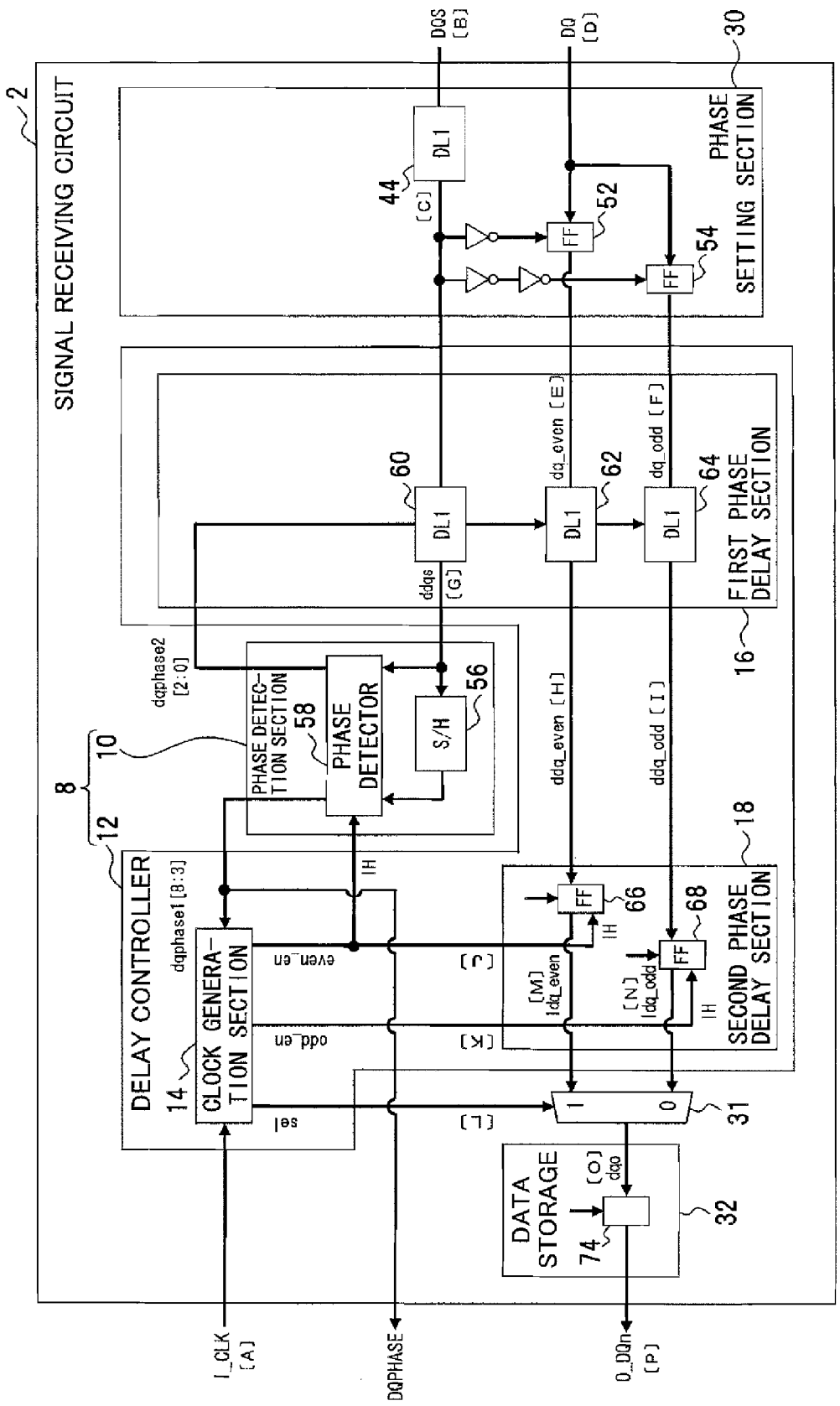
FIG. 20 is a drawing illustrating an example of a signal receiving circuit according to a third embodiment.

The third embodiment is described with reference to FIG. 20. FIG. 20 is a drawing illustrating an example of the signal receiving circuit according to the third embodiment. In FIG. 20, the same reference numerals are used to describe the same elements in FIG. 3.

Similar to the above embodiments, the phase detection section 10 in this embodiment includes the S/H circuit 56 and the phase detector 58. The S/H circuit 56 is the same as that in the above embodiments. Therefore, the description thereof is herein omitted.

Further, the phase detector 58 acquires the first delay information (dqphase1) and the second delay information (dqphase2) as the phase information (DQPHASE). In this case, the first delay information (dqphase1) is the information of the upper (first) 4 bits in the delay information described above (FIG. 14). The second delay information (dqphase2) is the information of the lower (last) 3 bits in the delay information described above (FIG. 14).

In the configuration, the first delay information (dqphase1) is transmitted to the clock generation section 14. By doing this, the clock generation section 14 outputs the CLK signal having the delay amount corresponding to the delay information. In this case, the CLK signal having the same phase is applied to the phase detector 58 and the FF 66 from the clock generation section 14. Further, the CLK signal inverted from the CLK signal is applied to the FF 68. Similarly, the selection control signal is applied to the selector 31 from the clock generation section 14. Further, the second delay information (dqphase2) is applied to the DL 60, 62, and 64.

By having the configuration as well, similar to the second embodiment, the phase delay may be performed on the DQS signal and the DQ signal in accordance with the phase difference. Further, the operational waveforms of the elements are similar to those in the second embodiment (FIGS. 3, 4, and 5). Therefore, in FIG. 20, the same reference numerals are used to describe the same elements in FIG. 3. Descriptions in this embodiment are the same as those in the second embodiment, therefore, the repeated descriptions are herein omitted.

Other Embodiments (1) In the above embodiment, the signal receiving circuit 2 included in the memory controller 6 is exemplarily described as the signal receiving circuit. However, the present invention is not limited to the signal receiving circuit 2 described in the above embodiments. For example, the signal receiving circuit according to an embodiment may also be applied to circuits other than the memory interface such as the memory controller 6 and used to receive a signal having phase variation.

Figure 21:
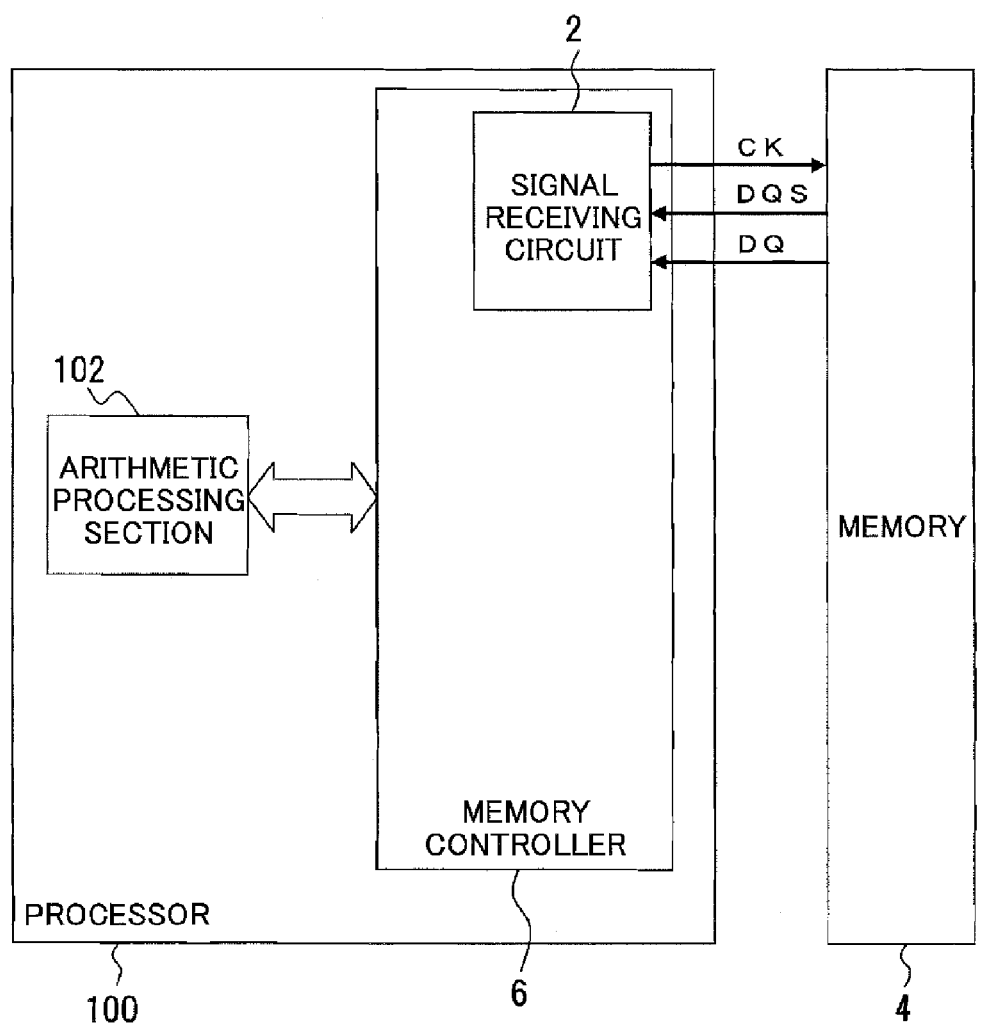
FIG. 21 is a drawing illustrating an example of a processor according another embodiment.

(2) In the above embodiments, the memory controller 6 is described. However, the memory controller in the present invention is not limited to the memory controllers described in the above embodiments. For example, the memory controller described in the above embodiment may be used as a processor 100 (FIG. 21). Further, the memory controller described in the above embodiment may be used as a computer 200 (FIG. 22).

(3) The processor 100 may be a CPU (Central Processing Unit) or an MPU (Micro Processor Unit). As illustrated in FIG. 21, the processor 100 may include the memory controller 6 controlling the data transmission of the memory 4 and an arithmetic processing section 102 which is a means to execute arithmetic processing. In this case, the memory controller 6 may include the signal receiving circuit 2 described above. In this configuration as well, the effects described above may be obtained, the speed of the data transmission may be increased, and the reliability may also be increased.

Figure 22:
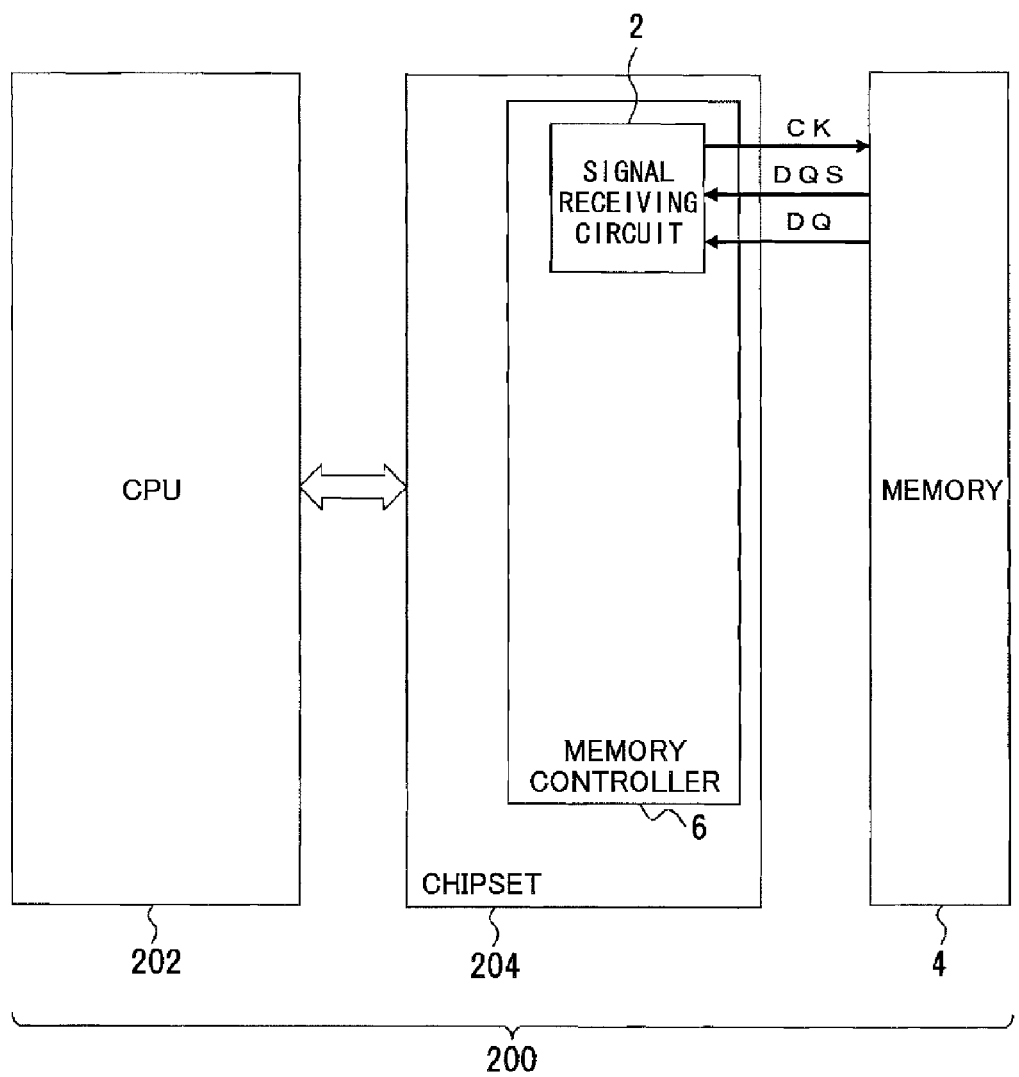
FIG. 22 is a drawing illustrating an example of a computer according another embodiment.

(4) As illustrated in FIG. 22, in the computer 200, the memory controller 6 may be included in a chipset 204 provided between a CPU (Central Processing Unit) 202 and the memory 4. In this case, the memory controller 6 may include the signal receiving circuit 2 described above. In this configuration as well, the effects described above may be obtained, the speed of the data transmission may be increased, and the reliability may also be increased.

(5) The memory controller 6 may be included in the CPU 202, and the memory controller 6 includes the signal receiving circuit 2 described above. In this configuration as well, the effects described above may be obtained, the speed of the data transmission may be increased, and the reliability may also be increased.

(6) In the above embodiments, the frequency of the internal clock signal as a reference is set as 2 GHz, and the divided clock signal having a frequency of 500 MHz is used to compare the phases. However, the present invention is not limited to this configuration. An arbitrary frequency may be set as the clock signal. Namely, unless otherwise described, the figures described in the above descriptions are examples only.

(7) In the procedure (FIG. 2) of the phase control described in the first embodiment, a step of generating plural clock signals having the phases different from each other, the phases being determined by using the delay amount as a unit, may be further included, and the clock signal may be selected from among the plural clock signals. Further, a step of executing a function to store the output data having the phase delayed by the second phase delay section 18 into the data storage 32 may further be included.

Comparative Example

As a comparative example, an example of a signal receiving circuit receiving a signal having phase variation and included in a memory controller is described.

Figure 25:
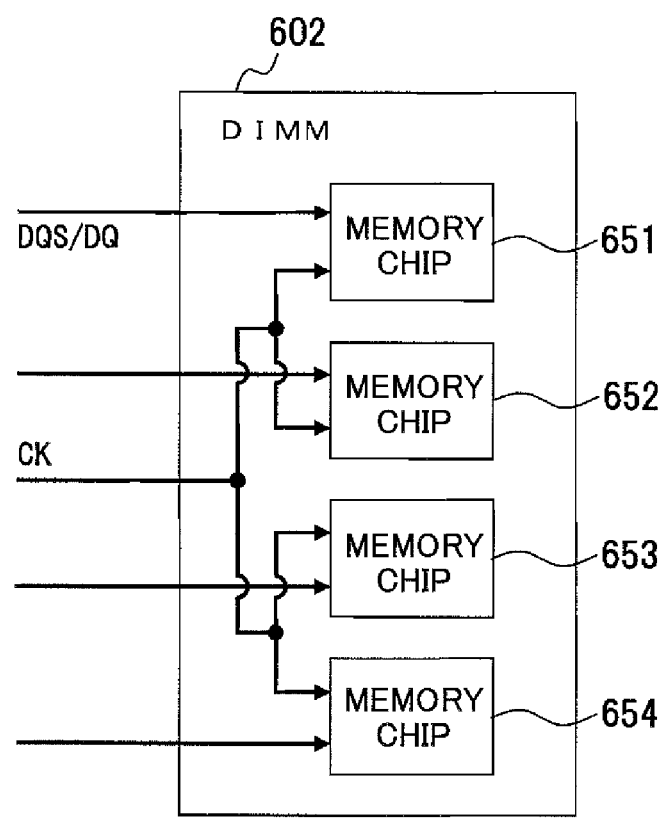
FIG. 25 is a drawing illustrating a wiring configuration on a DIMM.
Figure 26:
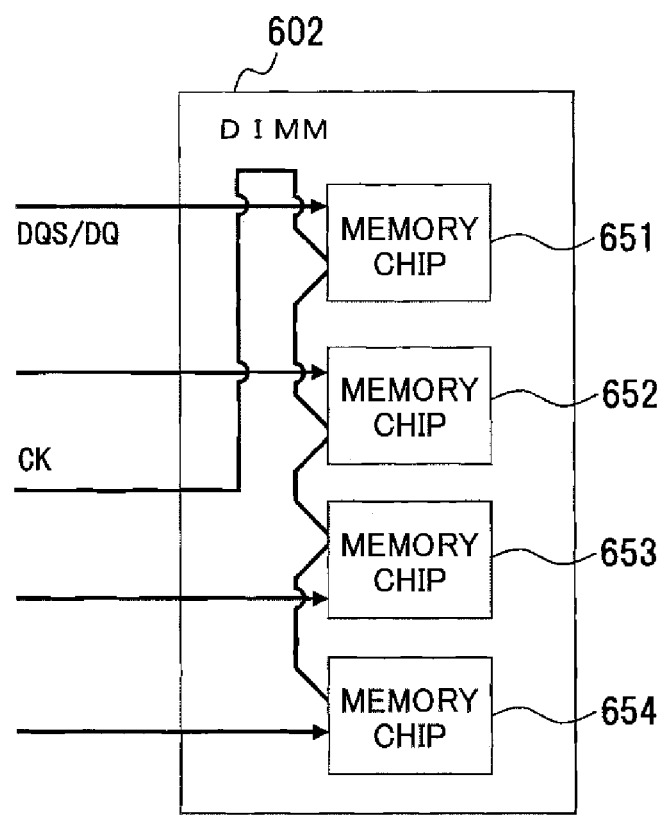
FIG. 26 is a drawing illustrating another wiring configuration on the DIMM.

The comparative example is described with reference to FIGS. 23, 24, 25, and 26. FIG. 23 illustrates the comparative example of the memory controller. FIG. 24 illustrates an example of a trial calculation of the delay variation of the circuit. FIG. 25 illustrates a clock wiring configuration on a DIMM. FIG. 26 illustrates another wiring configuration on the DIMM.

To receive the DDR signal from the DIMM in the simplest manner, a memory controller 600 may be used. The memory controller 600 includes a signal receiving circuit 604 as a means to receive the signal from a DIMM 602. Further, the signal receiving circuit 604 includes the clock tree section 606 as a means to apply a clock signal to the signal receiving circuit 604. The clock tree section 606 and the signal receiving circuit 604 are integrated in an LSI.

In this case, the signal receiving circuit 604 receives a signal having phase variation as input data so as to serve as a signal receiving circuit of a DDR memory interface circuit. The signal receiving circuit 604 includes FF circuits 608, 610, 612, 614, and 616, the DLs 618, 620, an output buffer 622, and input buffers 624 and 626. The clock tree section 606 serves as an LSI internal circuit section, and includes inverters 628, 630, 632, 634, 636, 638, and 640. The DIMM 602 includes an input buffer 642 and an output buffer 644.

Here, the signal receiving circuit 604 receives the CLK signal generated by the clock tree section 606, generates a CK signal CK0, and transmits the CK signal CK0 to the DIMM 602. The DIMM 602 generates a DQS signal based on the CK signal, and transmits the DQS signal and the CK signal to the signal receiving circuit 604. The signal receiving circuit 604 performs retiming on the DQ signal by using the DQS signal, and switches to the internal clock. In this case, to reliably receive the data by latching at the receiving point, it is desired that the timing relationship between the internal clock and the received data is within a certain range.

It is considered that there are various causes of the delay variation in the signal receiving circuit 604. In the following, it is assumed that all the various causes are considered. In this case, the input part of the FF 610 on the output side of the DL 618 is assumed as the signal receiving point (FIG. 23). Even when it is assumed that the transmission path length is 0 mm, from the viewpoint of the clock reference of the latch at the receiving point in the LSI of the signal receiving circuit 604, the received data have the delay variation in a range from 982 ps to 4,156 ps. This width (3,174 ps) is longer than the clock period and is also longer than the data width (in 1 GT/s transmission, the data width is 1,000 ps). The delay varies because of not only manufacturing factors but also environmental factors (e.g., power voltage and device temperature). Therefore, during the operation, the phase of the received data may vary (as jitters).

On the other hand, in the DDR interface, as illustrated in FIG. 25, the CK signal has been transmitted to memory chips 651, 652, 653, and 654 of the DIMM 602 using star-wired lines having the same length. However, in the DDR 3 interface, a new clock wiring method called a Fly-by topology (FIG. 26) is employed. In the Fly-by wiring, as illustrated in FIG. 26, the CK signal is sequentially transmitted to the memory chips 651, 652, 653, and 654 of the DIMM 602. By using the Fly-by wiring, the waveform quality of the signal may be improved. However, data transmission/receiving timings may vary among the DQS groups. It is expected that the maximum clock delay variation due to the Fly-by wiring is approximately 1,000 ps, which is a large value that may not be ignored when compared with the signal transmission speed.

Relating to the timing difference between the CK signal and the DQS signal when data are transmitted and received, according to the JEDEC (Joint Electron Devices Engineering Council) standard, as the Write Leveling, a means to absorb the variation is described. However, nothing is described in the standards about the timing difference when a signal is received.

The memory controller, the processor, the computer, and the phase control method according to embodiments propose a mechanism that may absorb the delay variation of the DDR3 interface and the like. In the above embodiments, the delay to be addressed may be improved so as to be ignorable when compared with the signal transmission speed.

As described above, a signal receiving circuit, a memory controller, a processor, a computer, and a phase control method in the present application are not limited to the examples described above.

In the signal receiving circuit, the memory controller, the processor, the computer, and the phase control method described herein, the following effects may be obtained.

(1) The phased variation of the data signal may be resolved by applying the delay amount, determined by using a predetermined phase difference as a unit, and the delay in a range not exceeding the delay amount of the phase difference between the received signal and the clock signal. Therefore, the timings of the data signal may be optimized.

(2) By optimizing the timings of the data signal, the reliability of the data transmission may be improved.

(3) The delay amount may be controlled by using the delay corresponding to the delay amount determined by using the predetermined phase difference as a unit, and with the delay in a range not exceeding the delay amount, the amount of the delay processing may be reduced, so that the circuit scale may be reduced, and the processing speed may be increased.

(4) The present application may also be applied to a minus delay.

(5) The phase may be transferred from a reference clock domain of the data signal to an internal clock domain, and a delay mount (i.e., a phase difference amount) for clock transferring may be obtained.

(6) It may become possible to take delay information indicating the delay amount for transferring the phase difference between clocks.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiment of the present invention has been described in detail, it should be understood that various changes, substitutions, and alterations could be made hereto without departing from the spirit and scope of the invention.

The signal receiving circuit, the memory controller, the processor, the computer, and the phase control method in the present application are related to signal reception, control of the delay variation in a circuit, and provide a practically usable memory controller and the like. Therefore, they are useful.

What is claimed is:

1. A signal receiving circuit comprising:
a phase detection unit configured to detect a phase difference between a received phase reference signal and a clock signal; and
a delay control unit configured to
receive the phase difference,
delay a phase of the phase reference signal and a data signal in a range not exceeding a delay amount determined by using a predetermined phase difference as a unit of delay, and
change, when the phase difference exceeds the predetermined phase difference, a delay amount of the data signal by using the predetermined phase difference as a unit of change,
wherein the delay control unit comprises:
a first delay unit configured to delay the phase of the phase reference signal and the data signal in the range not exceeding the delay amount determined by using the predetermined phase difference as the unit of delay; and
a second delay unit configured to delay the phase of the data signal by changing the delay amount thereof by using the predetermined phase different as the unit of change.

2. The signal receiving circuit according to claim 1, wherein the data signal having the phase thereof delayed and output from the second delay unit is synchronized to the clock signal.

3. The signal receiving circuit according to claim 2, further comprising:
a data storage unit configured to store output data having a phase delayed by the second delay unit.

4. The signal receiving circuit according to claim 2, wherein the first delay unit is configured to serve as a variable delay circuit that delays the phase of the received signal in accordance with the delay amount.

5. The signal receiving circuit according to claim 1, further comprising:
a clock generation unit configured to generate plural clock signals having corresponding phases, a phase difference between the plural clock signals being determined by using the delay amount,
wherein the clock signal is selected in accordance with the phase difference.

6. The signal receiving circuit according to claim 5, wherein the clock generation unit is a divider that generates the clock signal by dividing an input clock, and a dividing ratio of the divider is $2^n$, where n is 1 or a natural number greater than 1.

7. A memory controller comprising:
the signal receiving circuit according to claim 1.

8. A processor comprising:
the memory controller according to claim 7.

9. A computer comprising:
the memory controller according to claim 7.

10. A processor comprising:
the signal receiving circuit according to claim 1.

11. A computer comprising:
the processor according to claim 10.

12. A computer comprising:
the signal receiving circuit according to claim 1.

13. A computer comprising:
a signal receiving circuit,
wherein the signal receiving circuit includes
a phase detection unit configured to detect a phase difference between a phase reference signal and a clock signal; and
a delay control unit configured to
receive the phase difference,
delay a phase of the phase reference signal and a data signal in a range not exceeding a delay amount determined by using a predetermined phase difference as a unit of delay, and
change, when the phase difference exceeds the predetermined phase difference, a delay amount of the data signal by using the predetermined phase difference as a unit of change,
wherein the delay control unit comprises:
a first delay unit configured to delay the phase of the phase reference signal and the data signal in the range not exceeding the delay amount determined by using the predetermined phase difference as the unit of delay; and
a second delay unit configured to delay the phase of the data signal by changing the delay amount thereof by using the predetermined phase different as the unit of change.

14. The computer according to claim 13, wherein the data signal having the phase thereof delayed and output from the second delay unit is synchronized to the clock signal.

15. A phase control method comprising:
executing a first function to compare a phase reference signal and a clock signal and detect a phase difference; and
executing a second function to
receive the phase difference,
delay a phase of the phase reference signal and a data signal in a range not exceeding a delay amount determined by using a predetermined phase difference as a unit of delay, and
change, when the phase difference exceeds the predetermined phase difference, a delay amount of the data signal by using the predetermined phase difference as a unit of change,
wherein the second function comprises:
delaying, in a first delay unit, the phase of the phase reference signal and the data signal in the range not exceeding the delay amount determined by using the predetermined phase difference as the unit of change; and
delaying, in a second delay unit, the phase of the data signal by changing the delay amount thereof by using the predetermined phase different as the unit of change.

16. The phase control method according to claim 15, further comprising:
executing a third function to synchronize, to the clock signal, the data signal having the phase thereof delayed and output from the second delay unit.

* * * * *